(12) United States Patent
Fukasawa

(10) Patent No.: US 7,872,360 B2
(45) Date of Patent: Jan. 18, 2011

(54) SEMICONDUCTOR DEVICE AND METHOD OF MANUFACTURING THE SAME

(75) Inventor: Norio Fukasawa, Aizuwakamatsu (JP)

(73) Assignee: Fujitsu Semiconductor Limited, Yokohama (JP)

( * ) Notice: Subject to any disclaimer, the term of this patent is extended or adjusted under 35 U.S.C. 154(b) by 234 days.

(21) Appl. No.: 12/042,025

(22) Filed: Mar. 4, 2008

(65) Prior Publication Data
US 2008/0224333 A1  Sep. 18, 2008

(30) Foreign Application Priority Data
Mar. 16, 2007 (JP) .............................. 2007-069349

(51) Int. Cl.
*H01L 23/28* (2006.01)
(52) U.S. Cl. ................. 257/787; 257/678; 257/774; 257/795; 257/E23.004; 257/E23.07; 257/E23.124
(58) Field of Classification Search ................ 257/787, 257/678, 774, 795, E23.004, E23.07, 23.124
See application file for complete search history.

(56) References Cited

U.S. PATENT DOCUMENTS

2002/0084538 A1*  7/2002  James et al. ................. 257/787
2004/0078964 A1*  4/2004  Itou et al. ..................... 29/840

FOREIGN PATENT DOCUMENTS

| JP | 09-082835 | 3/1997 |
| JP | 9-326544 A | 12/1997 |
| JP | 2000-124344 A | 4/2000 |
| JP | 2005-322659 A | 11/2005 |

OTHER PUBLICATIONS

Korean Office Action dated Mar. 26, 2010, issued in corresponding Korean Patent Application No. 10-2008-0023744.
Korean Office Action dated Jan. 26, 2010, issued in corresponding Korean Patent Application No. 10-2008-0023744.
Chinese Office Action dated May 22, 2009, issued in corresponding Chinese Patent Application No. 200810083671.3.

* cited by examiner

*Primary Examiner*—Long K Tran
(74) *Attorney, Agent, or Firm*—Fujitsu Patent Center

(57) ABSTRACT

A semiconductor device is disclosed that includes a wiring board having a via formed therein; a semiconductor element provided on the wiring board; a resist layer covering a surface of the wiring board, the resist layer having an opening in a part thereof positioned on the via; and a sealing resin covering the surface of the via in the opening and the resist layer, and sealing the semiconductor device.

9 Claims, 20 Drawing Sheets

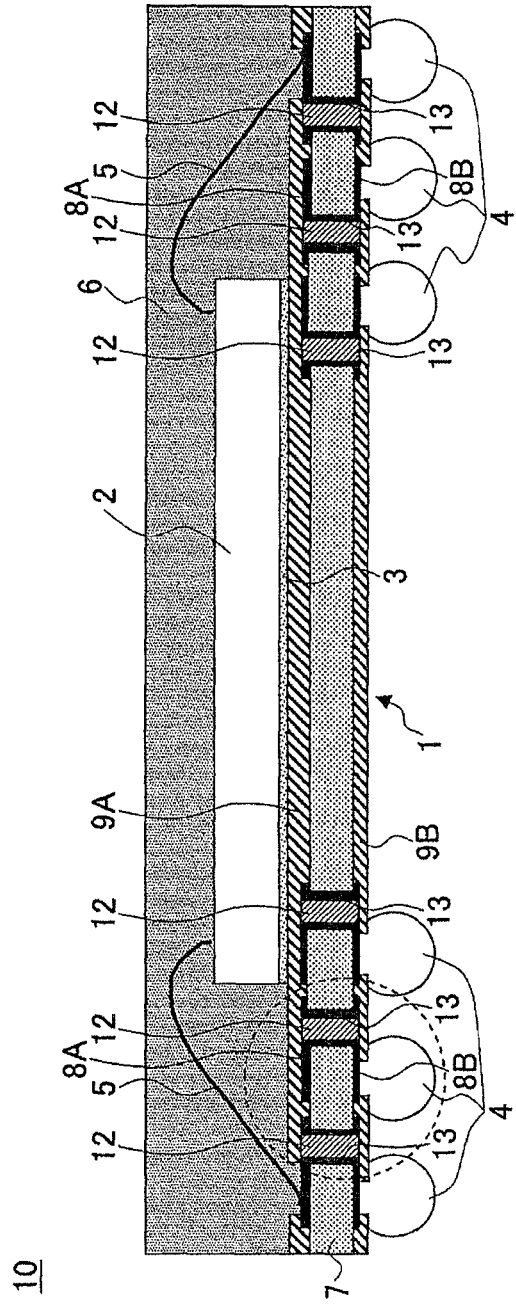

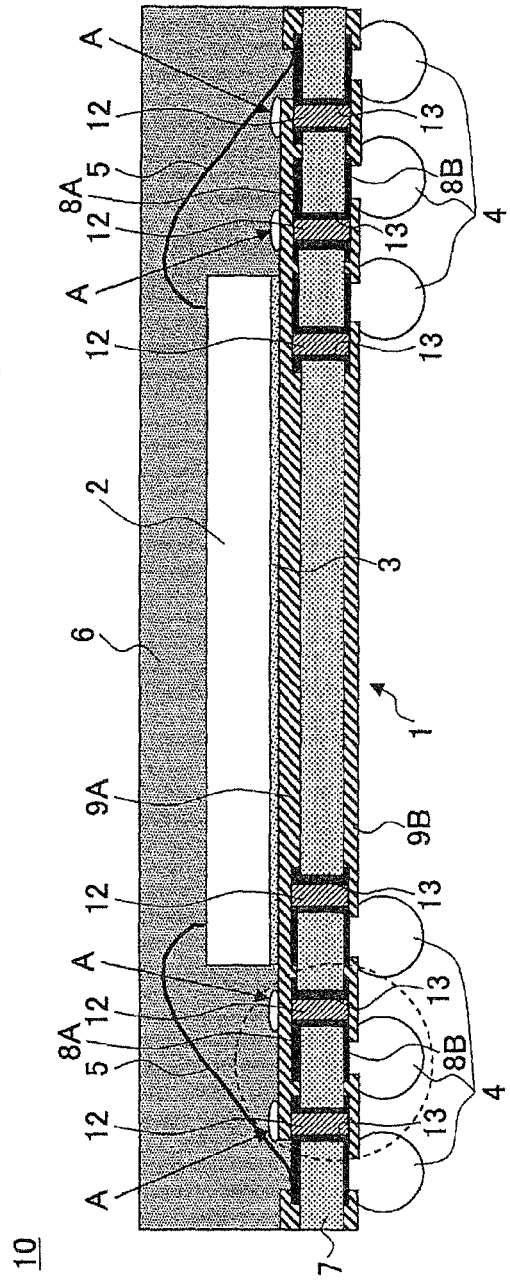

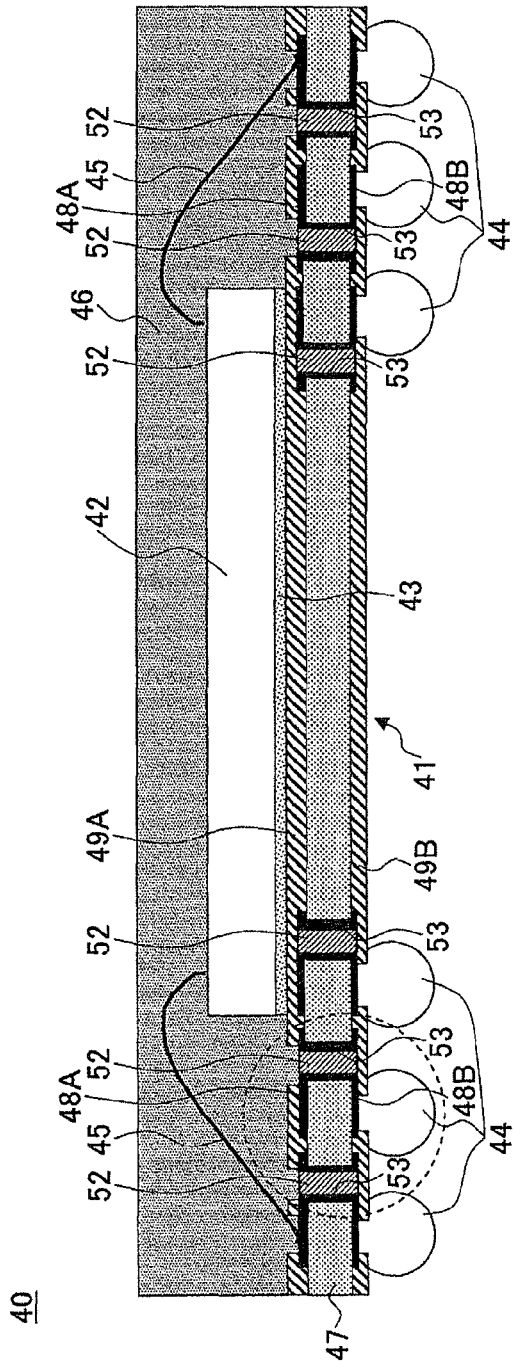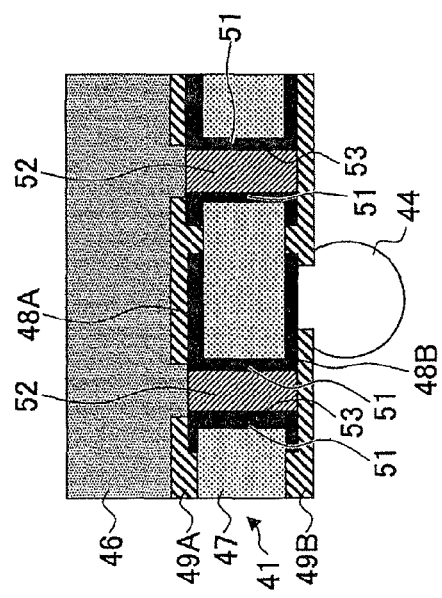

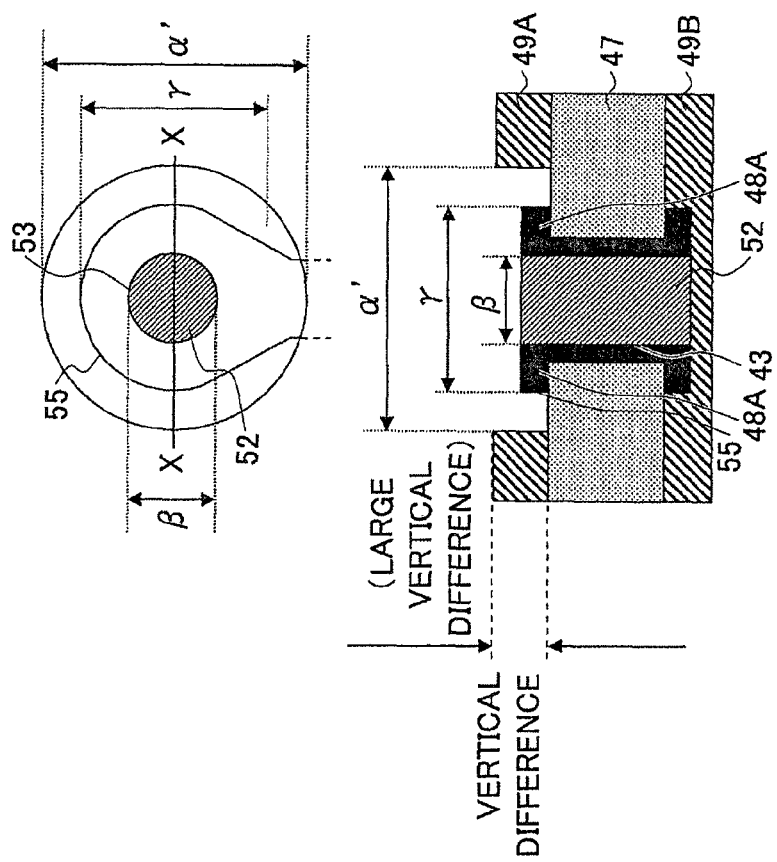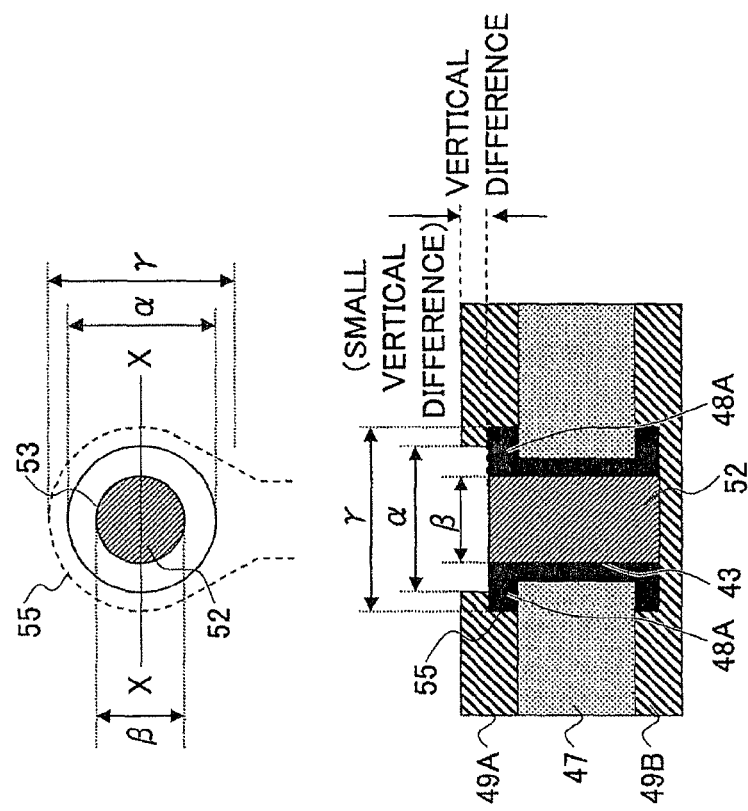

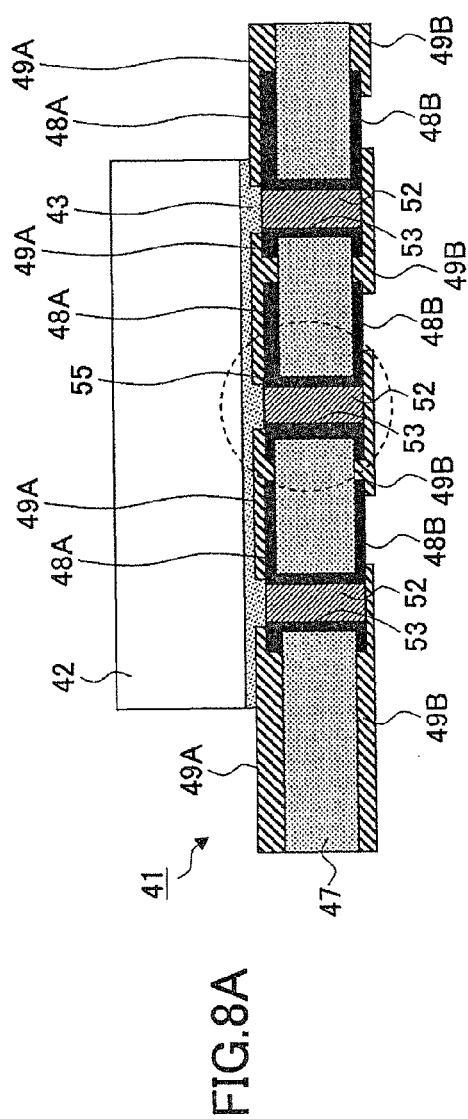
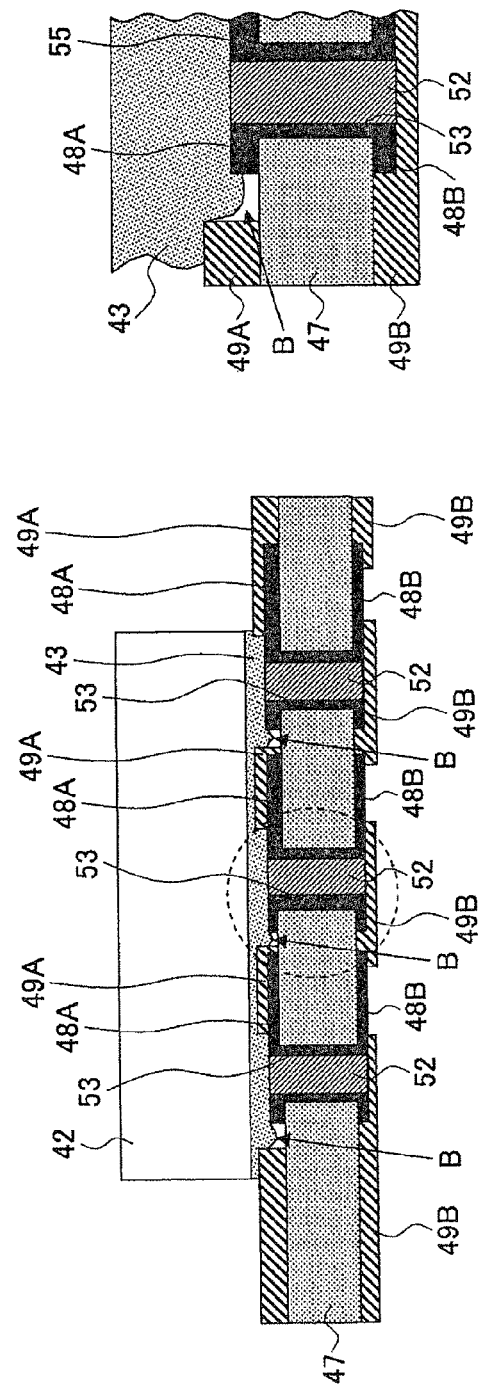
FIG.8A
FIG.8B

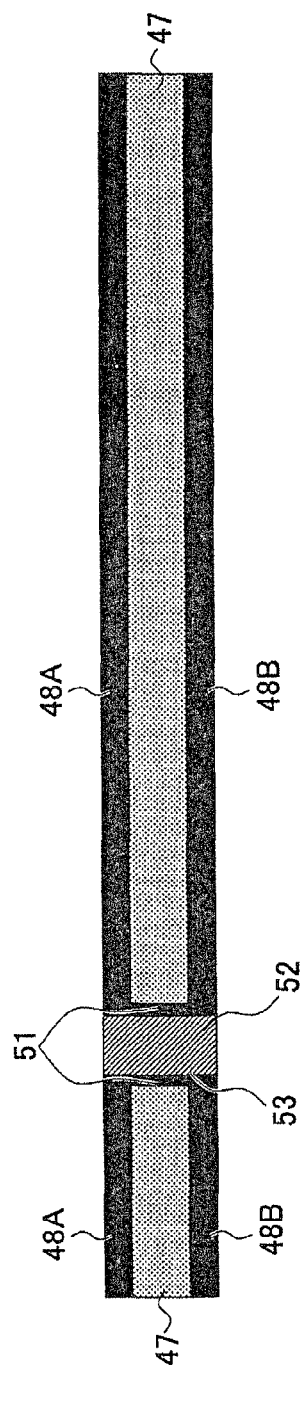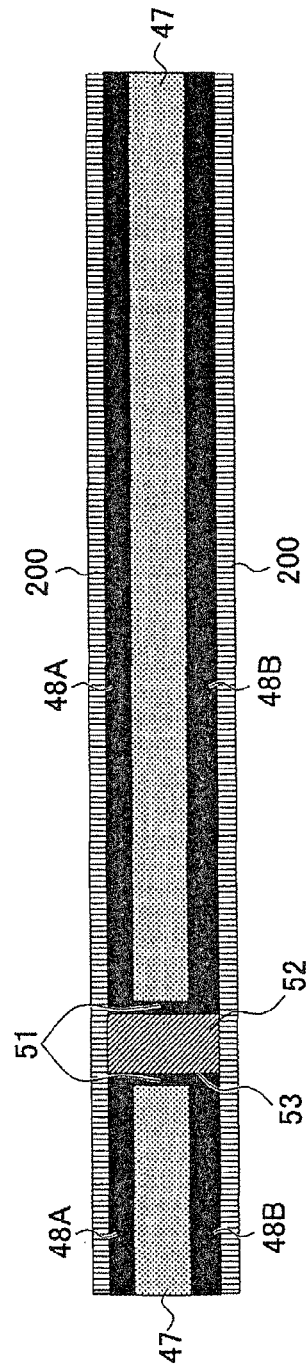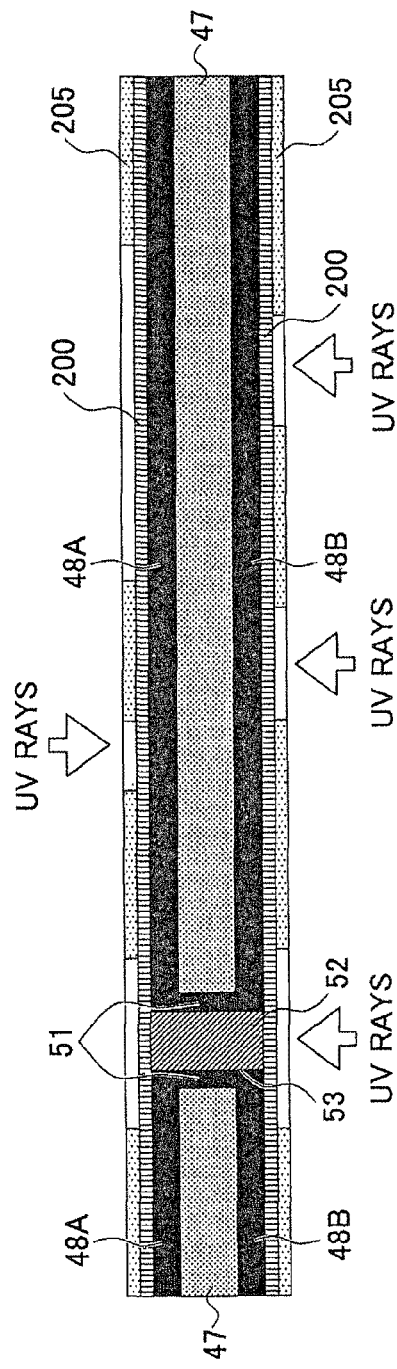

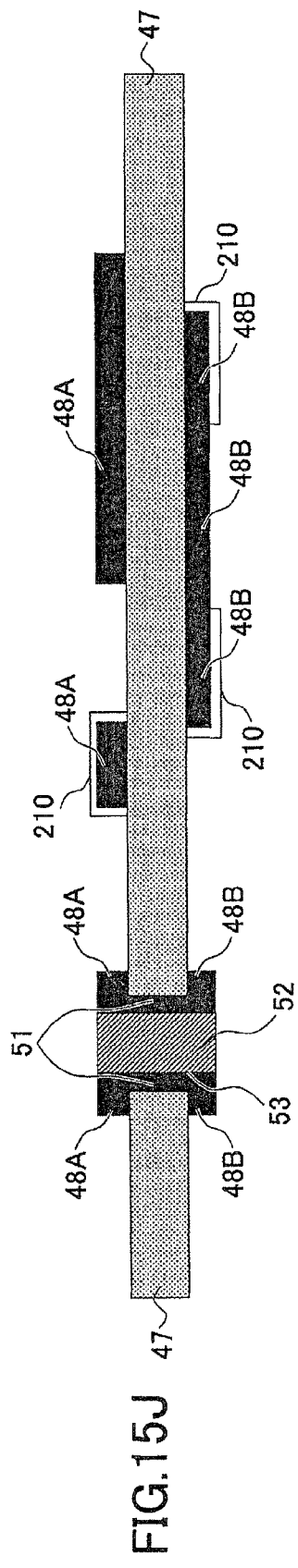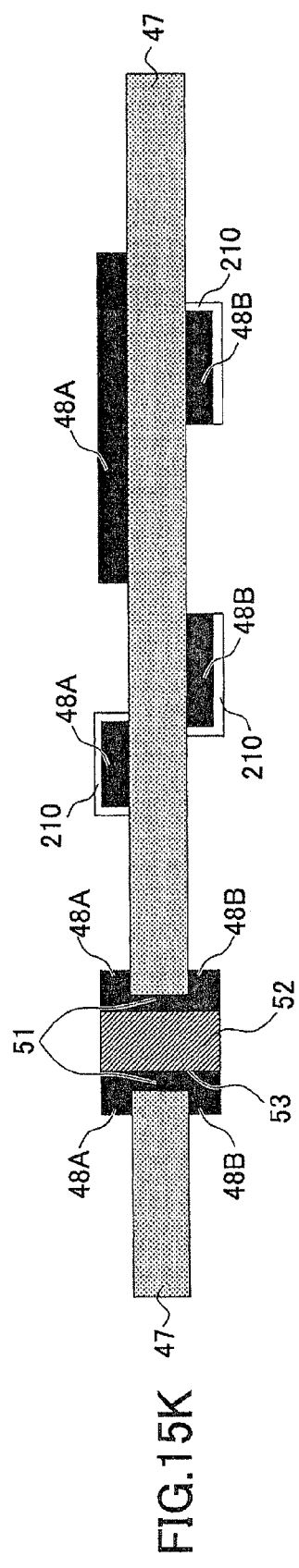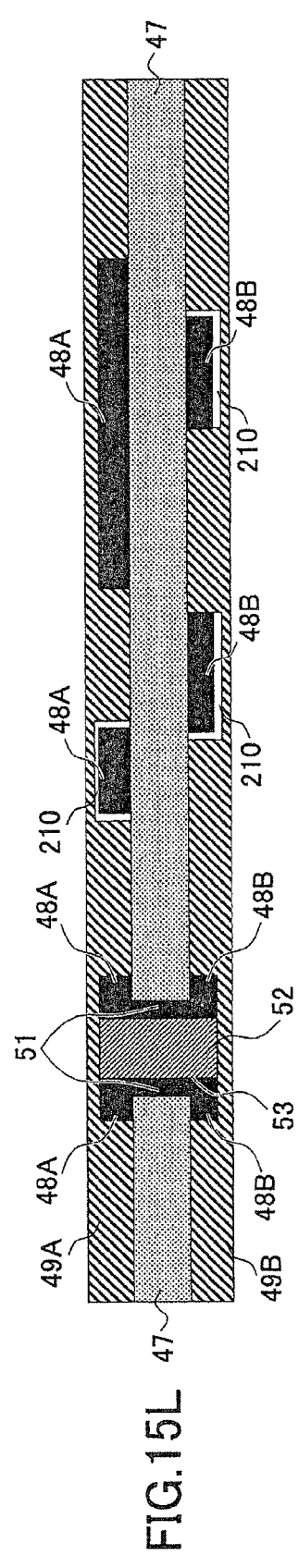

SEMICONDUCTOR DEVICE AND METHOD OF MANUFACTURING THE SAME

CROSS-REFERENCE TO RELATED APPLICATION

The present application is based on Japanese Priority Patent Application No. 2007-069349, filed on Mar. 16, 2007, the entire contents of which are hereby incorporated by reference.

BACKGROUND OF THE INVENTION

1. Field of the Invention

The present invention relates generally to semiconductor devices and methods of manufacturing the same, and more particularly to a semiconductor device having a semiconductor element mounted and resin-sealed on a wiring board in which vias are formed, and a method of manufacturing the same.

2. Description of the Related Art

There is a demand for reduction in the size and thickness of electronic components as electronic apparatuses have become smaller in size, higher in density, and higher in functionality. In response to this, surface mount packages including Ball Grid Array (BGA) are proposed as packages reduced in surface mount area by size reduction so as to be excellent for high-density mounting of semiconductor devices.

FIGS. 1A and 1B are diagrams showing the structure of a conventional semiconductor device. Specifically, FIG. 1A is a cross-sectional view of the semiconductor device, and FIG. 1B is an enlarged view of the part circled with a dotted line in FIG. 1A. In FIG. 1B, only one solder ball is graphically shown for convenience of description.

Referring to FIG. 1, a semiconductor device 10 has a structure where a semiconductor element 2 is mounted on one principal surface (upper surface) of a wiring board 1 with a die bonding material 3 such as a die bonding film interposed therebetween and multiple solder balls 4 formed mainly of solder and serving as external connection terminals such as spherical electrode terminals are provided in a grid-like manner on the other principal surface (lower surface) of the wiring board 1.

The semiconductor element 2 is formed by a known semiconductor manufacturing process using a silicon (Si) semiconductor substrate. External connection pads (whose graphical representation is omitted) to which bonding wires 5 formed of gold (Au) or the like are connected are provided on the upper surface of the semiconductor element 2. The semiconductor element 2 is electrically connected to the wiring board 1 through the bonding wires 5.

The upper side of the wiring board 1 is sealed with sealing resin 6 such as epoxy resin.

Thus, the semiconductor device 10 has the semiconductor element 2 packaged with the wiring board 1, the bonding wires 5, and the sealing resin 6 (into a module).

Here, a detailed description is given, with reference also to FIGS. 2A and 2B, of the structure of the wiring board 1. FIGS. 2A and 2B are diagrams showing the structure of the wiring board 1 of the semiconductor device 10 shown in FIGS. 1A and 1B. Specifically, FIG. 2A is a plan view of the wiring board 1, in which a graphical representation of a resist layer is omitted for convenience of description. FIG. 2B is a cross-sectional view of the wiring board 1 of FIG. 2A, taken along the line A-A.

The wiring board 1, which may also be referred to as an interposer, is a support board having a board base 7 formed of insulating resin such as glass epoxy resin, and a wiring (interconnect) layer 8A of copper (Cu) or the like provided on the surface (upper surface) of the board base 7.

The wiring layer 8A except a region to which the bonding wires 5 are connected is selectively covered with a resist layer 9A. That is, the resist pattern on the wiring board 1, on which the semiconductor device 2 is mounted, has a structure where part of the pattern where the wiring board 1 is electrically connected to the semiconductor element 2 by wire bonding is open while the other part is covered with the resist layer 9A.

A wiring (interconnect) layer 8B formed of copper (Cu) or the like is also provided at the other principal surface (lower surface) of the wiring board 1, and the wiring layer 8B is selectively covered with a resist layer 9B. That is, in the resist pattern on the lower surface of the wiring board 1, only parts corresponding to parts of the wiring layer 8B to serve as mounting terminals are open for electrical connection, and the solder balls 4 are provided on the parts of the wiring layer 8B exposed through the open parts of the resist pattern.

Vias 13 are formed inside the wiring board 1. In each via 13, a through hole is formed and a wiring (interconnect) part 11 is provided on the peripheral surface of the through hole. The entire through hole is plated so as to ensure the electrical continuity of the layers of the wiring board 1. The through hole is filled with via filling resin 12 such as epoxy resin. The wiring layer 8A and the wiring layer 8B, on which the solder balls 4 are provided, are connected through the vias 13.

Thus, the conventional semiconductor device 10 has a two-layer structure formed of the wiring board 1 and the sealing resin 6 provided on the wiring board 1 and containing the semiconductor element 2, etc. Further, the wiring board 1 of the semiconductor device 10 has a structure where the upper side of each via 13 filled with the via filling resin 12 is covered with the resist layer 9A.

Aside from the configuration shown in FIGS. 1A and 1B and FIGS. 2A and 2B, there is proposed a circuit board having an insulating layer, a via hole formed in the insulating layer and filled with a conductive material, and a wiring pattern formed on the surface of the insulating layer so as to be electrically connected to the conductive material, wherein a hole smaller in diameter than the via hole is formed at a position corresponding to the via hole in the wiring pattern so as to communicate with the via hole. (See Patent Document 1 listed below.)

Further, there is proposed a configuration where an increase in the adhesion between a wiring board and sealing resin is designed in the wiring board on which a semiconductor element is mounted by flip-chip bonding by forming a dummy via not to be filled with conductive paste in a region where the semiconductor element is to be mounted and filling the dummy via with the sealing resin. (See Patent Document 2 listed below.)

[Patent Document 1] Japanese Laid-Open Patent Application No. 9-82835

[Patent Document 2] Japanese Laid-Open Patent Application No. 2005-322659

However, the structure shown in FIGS. 1A and 1B and FIGS. 2A and 2B has the following problems.

FIGS. 3A and 3B are diagrams for illustrating problems of the conventional semiconductor device 10 shown in FIGS. 1A and 1B. FIG. 3A is a cross-sectional view of the semiconductor device 10, and FIG. 3B is an enlarged view of the part circled with a dotted line in FIG. 3A.

Referring to FIG. 3, the via filling resin 12, with which the vias 13 of the wiring board 1 are filled, has a coefficient of thermal expansion of $36 \times 10^{-6}$ through $48 \times 10^{-6}/°C.$, which is greater than the coefficient of thermal expansion of the sealing resin 6 ($13\times10^{-6}$ through $16\times10^{-6}/°$ C.) or the coefficient of thermal expansion of copper (Cu) forming the wiring layers 8A and 8B of the wiring board 1 ($16\times10^{-6}/°$ C.).

Accordingly, the via filling resin 12 with which the vias 13 are filled expands in the assembling time of the semiconductor device 10 or its heating process for packaging, and contracts after cooling. Therefore, stress concentrates on the periphery of the vias 13 of the wiring board 1 because of the differences in the coefficient of thermal expansion among the above-described materials when the temperature is high.

At this point, the adhesion between the sealing resin 6 and the resist layer 9A is reduced by the expansion or dehumidification of the wiring board 1, which has absorbed moisture when left in a predetermined atmosphere, at the interface part where the sealing resin 6 and the resist layer 9A selectively covering the wiring layer 8A of the wiring board 1 adhere to each other.

Further, the stress concentrating on the periphery of the vias 13 of the wiring board 1 becomes greater than the adhesion of the sealing resin 6 to the resist layer 9A, so that the adhesion between the sealing resin 6 and the resist layer 9A cannot be maintained. As a result, as shown in FIGS. 3A and 3B, the separation of the sealing resin 6 occurs at the interface between the resist layer 9A and the sealing resin 6 above the vias 13, so that air gaps (indicated by arrows A in FIGS. 3A and 3B) are formed in the sealing resin 6 at the interface (above the vias 13).

Further, in the conventional semiconductor device 10 shown in FIGS. 1A and 1B, only the part on the upper side of the wiring board 1 is sealed with the sealing resin 6, so that the semiconductor device 10 has a two-layer structure formed of the via filling resin 12 provided inside the wiring board 1 and the sealing resin 6 provided on the wiring board 1 and containing the semiconductor element 2, etc. Since the materials forming the semiconductor device 10 have different physical property values, there may be a large warp caused in the semiconductor device 10.

Such a warp of the semiconductor device 10 causes the vertical positions of the solder balls 4 to be different when the semiconductor device 10 is mounted on a motherboard. As a result, no connection can be established to the motherboard with the solder balls 4 that are positioned vertically high, and a short circuit may be caused between terminals with the solder balls 4 that are positioned vertically low.

SUMMARY OF THE INVENTION

According to one embodiment of the present invention, a semiconductor device includes a wiring board having a via formed therein; a semiconductor element provided on the wiring board; a resist layer covering a surface of the wiring board, the resist layer having an opening in a part thereof positioned on the via; and a sealing resin covering a surface of the via in the opening and the resist layer, and sealing the semiconductor device.

According to one embodiment of the present invention, a method of manufacturing a semiconductor device having a semiconductor element mounted and sealed with a sealing resin on a wiring board having a via formed therein includes the steps of forming a resist layer on a surface of the wiring board in which the via is filled with a via filling resin, and forming an opening in a part of the resist layer which part is positioned on the via by exposing and developing the resist layer.

BRIEF DESCRIPTION OF THE DRAWINGS

Other objects, features and advantages of the present invention will become more apparent from the following detailed description when read in conjunction with the accompanying drawings, in which:

FIGS. 1A and 1B are diagrams showing the structure of a conventional semiconductor device;

FIGS. 3A and 3B are diagrams for illustrating problems of the semiconductor device shown in FIGS. 1A and 1B;

FIGS. 4A and 4B are diagrams showing a structure of a first example of a semiconductor device according to an embodiment of the present invention;

FIGS. 7A and 7B are diagrams for illustrating one or more effects of the structure shown in FIG. 6 according to the embodiment of the present invention;

FIGS. 8A and 8B are diagrams for illustrating the one or more effects of the structure shown in FIG. 6 according to the embodiment of the present invention;

DETAILED DESCRIPTION OF THE PREFERRED EMBODIMENTS

Figure 2B:
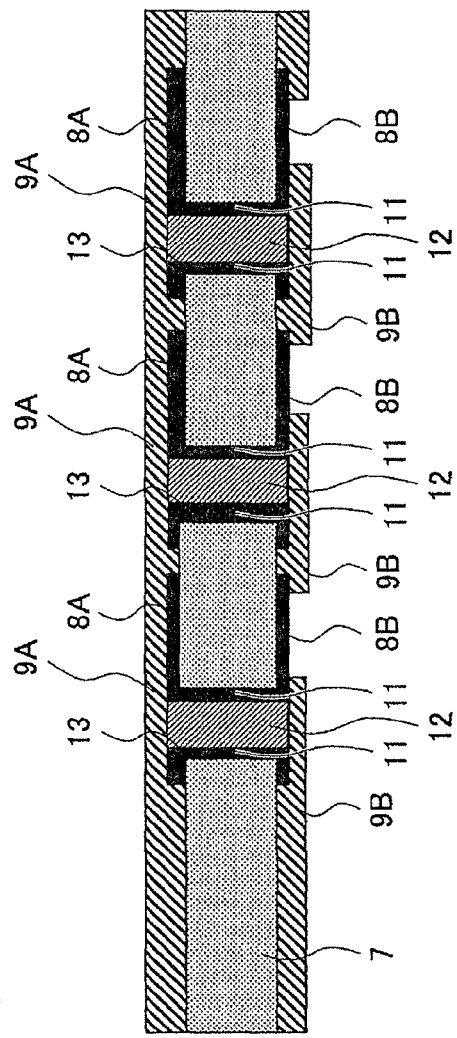
FIGS. 2A and 2B are diagrams showing a wiring board of the semiconductor device shown in FIGS. 1A and 1B.
Figure 2A:
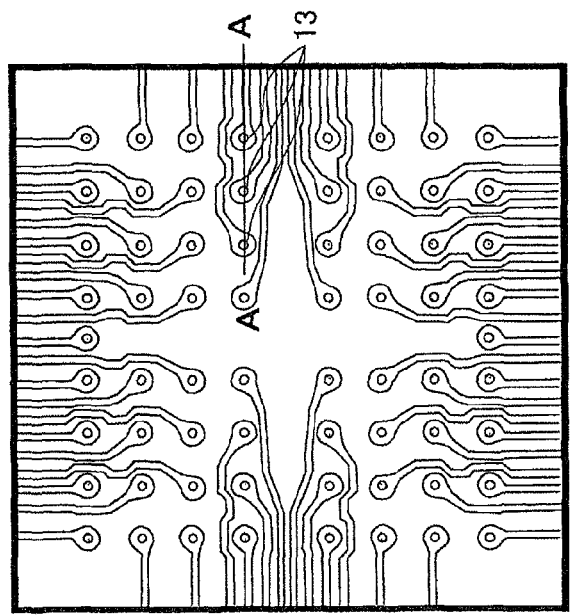

A description is given below, with reference to the accompanying drawings, of an embodiment of the present invention.

For convenience of description, a description is given first of a semiconductor device according to the embodiment of the present invention, and then a description is given of a method of manufacturing the semiconductor device.

[Semiconductor Device]

(a) First Example of the Semiconductor Device

FIGS. 4A and 4B are diagrams showing a structure of a first example of the semiconductor device according to the embodiment of the present invention. Specifically, FIG. 4A is a cross-sectional view of the semiconductor device, and FIG. 4B is an enlarged view of the part circled with a dotted line in FIG. 4A. For convenience of description, only one solder ball is graphically shown in FIG. 4B.

Referring to FIGS. 4A and 4B, a semiconductor device 40 includes a wiring board 41, a semiconductor element 42 mounted on one principal surface (upper surface) of the wiring board 41 with a die bonding material 43 such as a die bonding film interposed therebetween, and multiple solder balls 44 formed mainly of solder and serving as external connection terminals such as spherical electrode terminals provided in a grid-like manner on the other principal surface (lower surface) of the wiring board 41.

The semiconductor element 42 is formed by a known semiconductor manufacturing process using a silicon (Si) semiconductor substrate. External connection pads (whose graphical representation is omitted) to which bonding wires 45 formed of gold (Au) or the like are connected are provided on the upper surface of the semiconductor element 42. The semiconductor element 42 is electrically connected to the wiring board 41 through the bonding wires 45.

The upper side of the wiring board 41 is sealed with sealing resin 46. Examples of the sealing resin 46 include silicon resin, acrylic resin, and epoxy resin, but the sealing resin 46 is not limited to these examples.

Thus, the semiconductor device 40 has the semiconductor element 42 packaged with the wiring board 41, the bonding wires 45, and the sealing resin 46 (into a module).

Figure 5B:
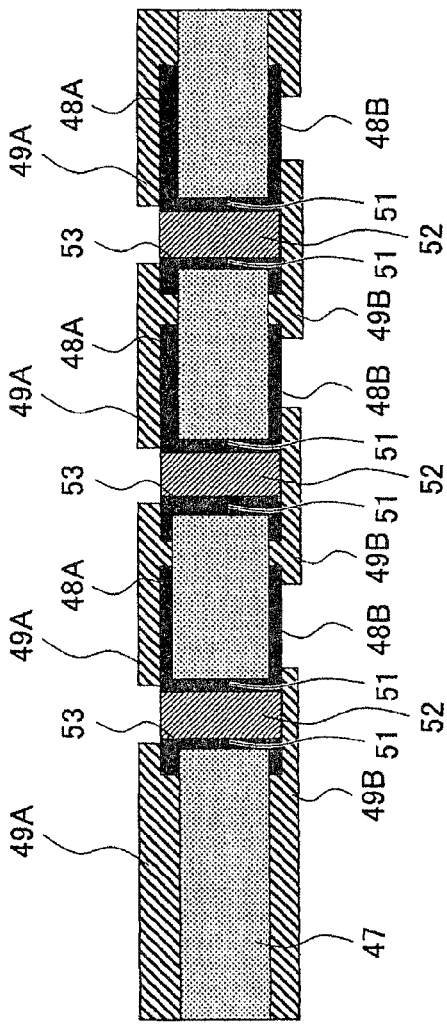
FIGS. 5A and 5B are diagrams showing a structure of a wiring board of the semiconductor device shown in FIGS. 4A and 4B according to the embodiment of the present invention.
Figure 5A:
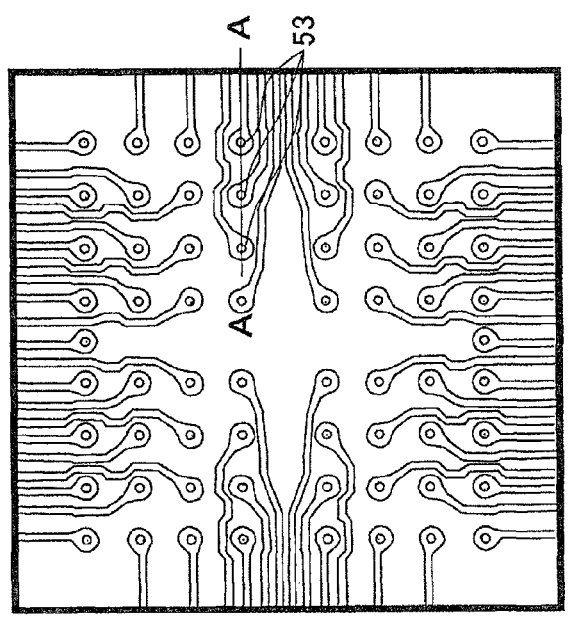

Here, a detailed description is given, with reference also to FIGS. 5A and 5B, of the structure of the wiring board 41. FIGS. 5A and 5B are diagrams showing a structure of the wiring board 41 of the semiconductor device 40 shown in FIGS. 4A and 4B. Specifically, FIG. 5A is a plan view of the wiring board 41, in which a graphical representation of a resist layer is omitted for convenience of description. FIG. 5B is a cross-sectional view of the wiring board 41 of FIG. 5A, taken along the line A-A.

The wiring board 41, which may also be referred to as interposer, is a support board having a board base 47 formed of insulating resin such as glass epoxy resin, and a wiring (interconnect) layer 48A of copper (Cu) or the like provided on the surface (upper surface) of the board base 47.

The wiring layer 48A except a region to which the bonding wires 45 are connected and a region on vias 53 formed inside the wiring board 41 is selectively covered with a resist layer 49A of solder resist or the like.

That is, the resist layer 49 on the wiring board 41 on which the semiconductor element 42 is mounted is open (has openings) in a pattern part where electrical connection is made to the semiconductor element 42 by wire bonding and on the vias 53, while covering the other part of the upper surface of the wiring board 41. The resist layer 49A is not provided and the sealing resin 46 is directly provided on the open part.

A wiring (interconnect) layer 48B formed of copper (Cu) or the like is also provided at the other principal surface (lower surface) of the wiring board 41, and the wiring layer 48B is selectively covered with a resist layer 49B of solder resist or the like.

That is, the resist layer 49B on the lower surface of the wiring board 41 is open so as to allow electrical connection to be established in a part to serve as mounting terminals. The solder balls 44 are provided on and the lower parts of the vias 53 are open to the open and exposed part of the wiring layer 48B.

As described above, the vias 53 are formed inside the wiring board 41. That is, in order to electrically connect the layers of the wiring board 41, through holes are formed so that each through hole has a wiring (interconnect) part 51 formed on its peripheral surface with copper (Cu) plating or the like. Further, the through holes are filled with via filling resin 52.

Examples of the via filling resin 52 include silicon resin, acrylic resin, and epoxy resin. In this example, resin different in physical properties, etc., from the sealing resin 46 is employed.

The wiring layer 48A and the wiring layer 48B, on which the solder balls 44 are provided, are connected through the vias 53.

Thus, on the wiring board 41 of the semiconductor device 40, the resist layer 49A, on which the semiconductor element 42 is mounted and resin-sealed with the sealing resin 46, is open (removed) on the via filling resin 52 with which the vias 53 are filled. As described above, stress concentrates on the via filling resin 52 of the vias 53. In this example, the resist layer 49A of this part is open (removed), and the open part is sealed with the sealing resin 46.

According to the structure shown in FIGS. 1A and 1B and FIGS. 2A and 2B, if the stress concentrating on the periphery of the vias 13 of the wiring board 1 becomes greater than the adhesion of the sealing resin 6 to the resist layer 9A, the adhesion between the sealing resin 6 and the resist layer 9A cannot be maintained, so that separation of the sealing resin 6 occurs at the interface between the resist layer 9A and the sealing resin 6 positioned above the vias 13 as shown in FIGS. 3A and 3B. On the other hand, it is possible to eliminate this problem according to the wiring board 41 of the semiconductor device 40 of this example.

That is, according to the wiring board 41 of the semiconductor device 40 of this example, the adhesion between the sealing resin 46 and the upper ends of the corresponding vias 53 is direct adhesion, not indirect adhesion with the interposition of a resist layer like the structure as shown in FIGS. 1A and 1B and FIGS. 2A and 2B, according to which it is difficult to ensure adhesion. Accordingly, compared with the structure shown in FIGS. 1A and 1B and FIGS. 2A and 2B, the adhesion of the sealing resin 46 increases so that it is possible to prevent separation of the sealing resin 46 shown in FIGS. 3A and 3B from occurring.

Further, like the semiconductor device 10 shown in FIGS. 1A and 1B, the semiconductor device 40 of this example has a two-layer structure formed roughly of the via filling resin 52 provided inside the wiring board 41 and the sealing resin 46 provided on the wiring board 41 and containing the semiconductor element 42, etc. However, since the resist layer 49A is open (removed) on the via filling resin 52 with which the vias 53 are filled, it is possible to avoid a decrease in the adhesion of the sealing resin 46 on the via filling resin 52.

That is, the interface part where the resist layer 49A and the sealing resin 46 adhere to each other is limited compared with the structure shown in FIGS. 1A and 1B. Therefore, even if there is a concentration of stress inside the vias 53 in a heating process for the packaging of the semiconductor device 40, it is possible to prevent the adhesion of the sealing resin 46 on the via filling resin 52 from becoming lower than the stress, so that it is possible to prevent separation of the sealing resin 46 on the via filling resin 52.

In this example, the resist layer 49A has openings formed on the via filling resin 52 with which the vias 53 are filled, and the openings have a diameter greater than the diameter of the through holes of the corresponding vias 53 and smaller than the diameter of corresponding via lands, which are the wiring layer 48A surrounding the through holes of the vias 53. A description is given, with reference to FIG. 6, of this configuration.

Figure 6:
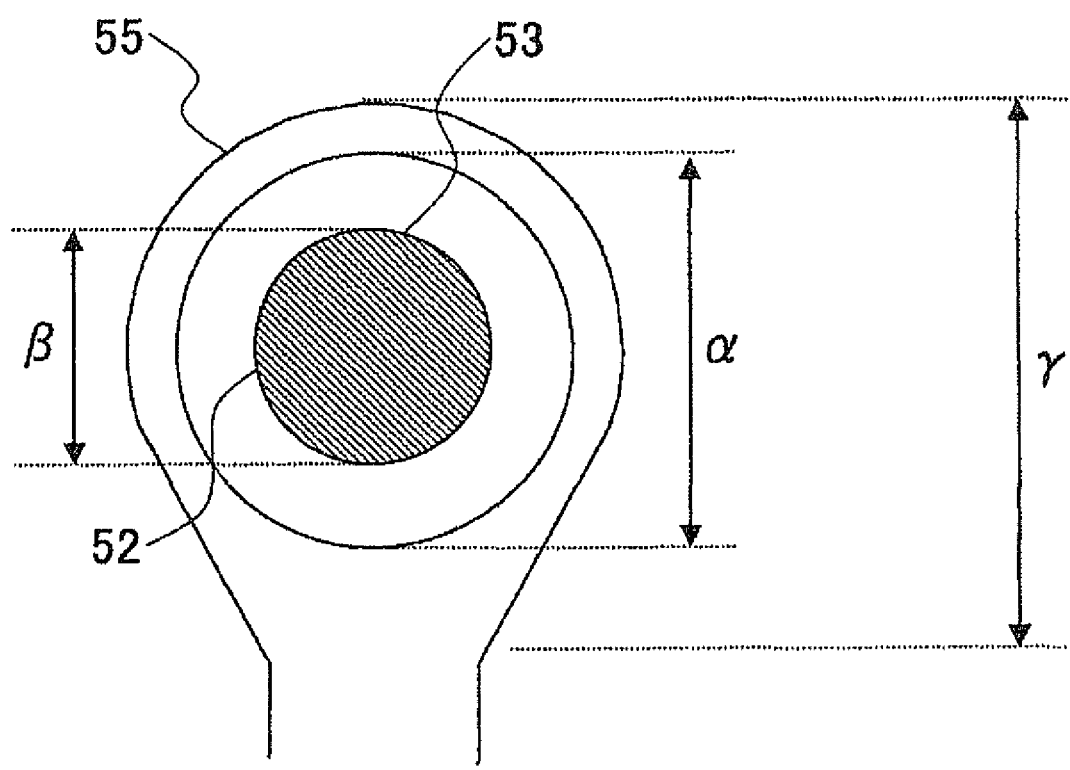
FIG. 6 is a plan view for illustrating the diameter of an opening in a resist layer on via filling resin with which vias are filled as shown in FIGS. 5A and 5B according to the embodiment of the present invention.

Here, FIG. 6 is a plan view for illustrating the diameter of an opening in the resist layer 49A on the via filling resin 52 with which the vias 53 are filled as shown in FIGS. 5A and 5B.

Referring to FIG. 6, the resist layer 49A is open (has openings) on the via filling resin 52 with which the vias 53 are filled as described above. The diameter α of each opening is determined to be greater than the diameter β of the through hole of the corresponding via 53 filled with the via filling resin 52 and smaller than the diameter γ of a corresponding via land 55, which is the wiring layer 48A surrounding the through hole of the via 53 (FIGS. 4A and 4B or FIGS. 5A and 5B). For example, the diameters α, β, and γ are determined so as to satisfy α:β:γ=1:0.4 through 0.6:1.2 through 1.5.

A description is given, with reference to FIGS. 7A and 7B and FIGS. 8A and 8B, of one or more effects of this structure.

FIGS. 7A and 7B are diagrams for illustrating one or more effects of the structure shown in FIG. 6. More specifically, FIG. 7A shows a structure according to this example, and FIG. 7B shows a structure in the case where the opening diameter α' of the resist layer 49A is greater than the diameter γ of the corresponding via land 55. In each of FIG. 7A and FIG. 7B, the lower drawing shows a cross-sectional view of the upper drawing taken along the line X-X.

FIGS. 8A and 8B are diagrams for illustrating the one or more effects of the structure shown in FIG. 6, showing the structure of FIG. 7A and the structure of FIG. 7B, respectively, where the semiconductor element 42 is mounted on the resist layer 49A with the die bonding material 43 such as a die bonding film interposed therebetween. In each of FIG. 8A and FIG. 8B, the right-hand drawing is an enlarged view of the part indicated with a dotted line in the left-hand drawing.

Referring to FIGS. 7A and 7B, the difference in level (vertical difference) between the vertical position of the upper surface of the resist layer 49A and the vertical position of the upper surface of the via 53 in the case shown in FIG. 7A, where the opening diameter α of the resist layer 49A is determined to be greater than the diameter β of the through hole of the via 53 filled with the via filling resin 52 and smaller than the diameter γ of the via land 55, is smaller than the difference in level (vertical difference) between the vertical position of the upper surface of the resist layer 49A and the vertical position of the upper surface of the board base 47 in the case shown in FIG. 7B, where the opening diameter α' of the resist layer 49A is determined to be greater than the diameter γ of the via land 55.

Accordingly, in the case of mounting the semiconductor element 42 on the resist layer 49A on the wiring board 41 with the die bonding material 43 such as a die bonding film interposed therebetween in the structure shown in FIG. 7A as shown in FIG. 8A, it is possible to ensure adhesion and fixation of the semiconductor element 42 to the resist layer 49A with the die bonding material 43 interposed therebetween.

On the other hand, in the case shown in FIG. 7B, where the opening diameter α' of the resist layer 49A is determined to be greater than the diameter γ of the via land 55, it is not possible, as shown in FIG. 8B, to ensure that the part formed by the vertical difference between the vertical position of the upper surface of the resist layer 49A and the vertical position of the upper surface of the board base 47 is filled with the die bonding material 43. Accordingly, the adhesion of the semiconductor element 42 to the resist layer 49A is insufficient so as to cause separation of the die bonding material 43 as indicated by arrows B, so that an air gap may be caused in the above-described part formed by the vertical difference.

Such an air gap may cause a decrease in the adhesion of the die bonding material 43 or the acceleration of moisture absorption by the package. It is not preferable to have moisture absorbed by the package and gathered in the air gap because a heating process necessary for solder bonding in mounting the semiconductor device 40 on a motherboard may cause sudden evaporation and subsequent explosion of the moisture, thereby causing damage to the package.

By determining the opening diameter α of the resist layer 49A so that the opening diameter α is greater than the diameter β of the through hole of the via 53 filled with the via filling resin 52 and smaller than the diameter γ of the via land 55 as shown in FIG. 7A, it is possible to reduce the vertical difference between the vertical position of the upper surface of the resist layer 49A and the vertical position of the upper surface of the via 53, so that it is possible to prevent generation of such an air gap.

With respect to the case shown in FIG. 8A, a description is given of the vias 53 positioned below the semiconductor element 42. In this case, with respect to the vias 53 positioned in the lateral directions from the semiconductor element 42 and covered with the sealing resin 46 (FIGS. 4A and 4B) as well, it is desirable for the same reason as set forth above to determine the opening diameter α of the resist layer 49A so that the opening diameter α is greater than the diameter β of the through hole of the via 53 filled with the via filling resin 52 and smaller than the diameter γ of the via land 55 as shown in FIG. 7A, thereby reducing the vertical difference between the vertical position of the upper surface of the resist layer 49A and the vertical position of the upper surface of the via 53.

[Second Example of Semiconductor Device]

Next, a description is given of a second example of the semiconductor device according to the embodiment of the present invention.

Figure 9A:
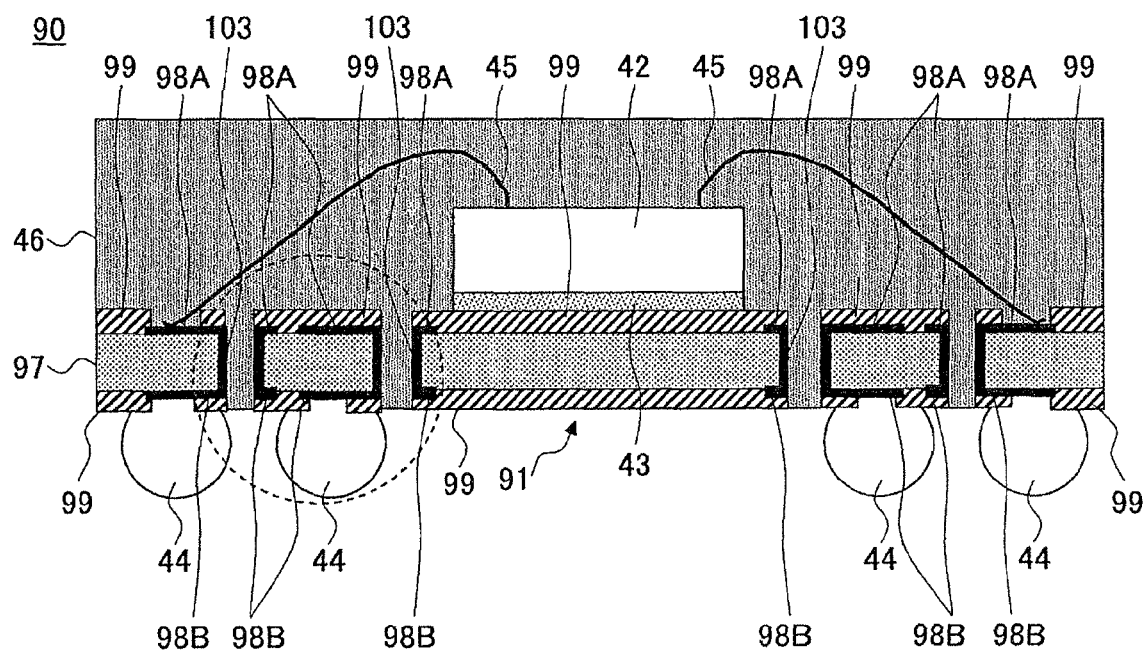
FIGS. 9A and 9B are diagrams showing a structure of a second example of the semiconductor device according to the embodiment of the present invention.
Figure 9B:
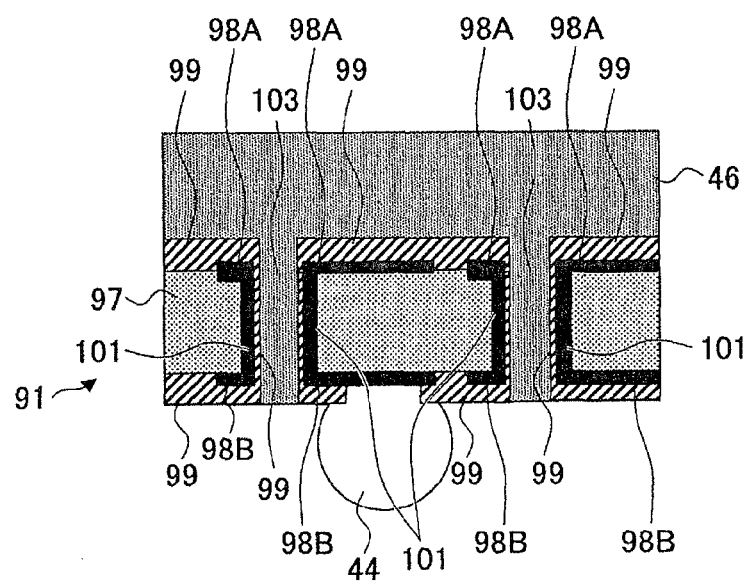

FIGS. 9A and 9B are diagrams showing a structure of the second example of the semiconductor device according to the embodiment of the present invention. Specifically, FIG. 9A is a cross-sectional view of the semiconductor device, and FIG. 9B is an enlarged view of the part circled with a dotted line in FIG. 9A. In FIG. 9B, only one solder ball is graphically shown for convenience of description.

Figure 10B:
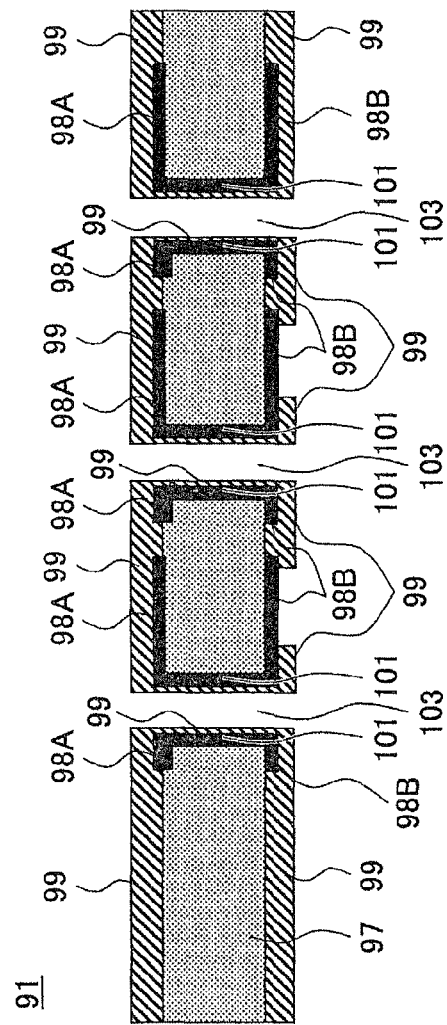
FIGS. 10A and 10B are diagrams showing a structure of a wiring board of the semiconductor device shown in FIGS. 9A and 9B according to the embodiment of the present invention.
Figure 10A:
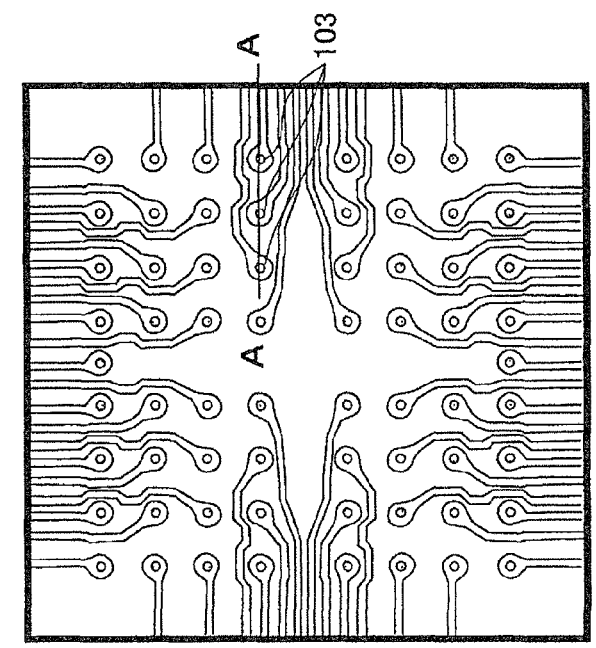

FIGS. 10A and 10B are diagrams showing a structure of a wiring board 91 of a semiconductor device 90 shown in FIGS. 9A and 9B. Specifically, FIG. 10A is a plan view of the wiring board 91, in which a graphical representation of a resist layer is omitted for convenience of description. FIG. 10B is a cross-sectional view of the wiring board 91 of FIG. 10A, taken along the line A-A.

In FIGS. 9A and 9B, the same elements as those of the semiconductor device 40 described with reference to FIGS. 4A and 4B are referred to by the same numerals, and a description thereof is omitted.

As shown in FIGS. 9A and 9B, the semiconductor device 90 of this example also has the semiconductor element 42 packaged with the wiring board 91, the bonding wires 45, and the sealing resin 46 (into a module) the same as the above-described first example of the semiconductor device. However, the wiring board 91 has a structure different from that of the wiring board 41 of the above-described semiconductor device 40.

The wiring board 91, which may also be referred to as interposer, is a support board having a board base 97 formed of insulating resin such as glass epoxy resin, and a wiring (interconnect) layer 98A of copper (Cu) or the like provided on the surface (upper surface) of the board base 97. A wiring (interconnect) layer 98B formed of copper (Cu) or the like is also provided at the other principal surface (lower surface) of the wiring board 91.

Vias 103 are formed inside the wiring board 91. That is, through holes are formed in the wiring board 91 so that each through hole has a wiring (interconnect) part 101 formed of copper (Cu) or the like on its peripheral surface so as to electrically connect the wiring layers 98A and 98B.

The wiring part 101, the wiring layer 98A except a region thereof to which the bonding wires 45 are connected, and the wiring layer 98B except regions on which the solder balls 44 are provided are selectively covered with a resist layer 99 of solder resist or the like. On the other hand, the resist layer 99 is not provided on the through holes of the vias 103 at their respective upper and lower ends.

The through holes of the vias 103 are filled with the same sealing resin 46 as provided on the wiring board 91. The filling of the through holes of the vias 103 with the sealing resin 46 is performed unitarily with the provision of the sealing resin 46 on the wiring board 91 for resin sealing.

Thus, the wiring layers 98A and 98B are electrically connected with the wiring part 101 provided in the vias 103 in the wiring board 91 of the semiconductor device 90, while the through holes of the vias 103 are filled with the sealing resin 46 so that the single resin of the sealing resin 46 is provided in the semiconductor device 90.

In the structure shown in FIGS. 1A and 1B and FIGS. 2A and 2B, the vias 13 are filled with the via filling resin 12, which is different from the sealing resin 6, and the upper sides of the vias 13 are covered with the resist layer 9A. If the stress concentrating on the periphery of the vias 13 of the wiring board 1 becomes greater than the adhesion of the sealing resin 6 to the resist layer 9A, the adhesion between the sealing resin 6 and the resist layer 9A cannot be maintained, so that separation of the sealing resin 6 occurs at the interface between the resist layer 9A and the sealing resin 6 positioned above the vias 13 as shown in FIGS. 3A and 3B. On the other hand, it is possible to eliminate this problem according to the wiring board 91 of the semiconductor device 90 of this example.

That is, whereas stress concentrates on the upper side of the via filling resin 12 of the vias 13 of the wiring board 1 of the semiconductor device 10 in the structure shown in FIGS. 1A and 1B and FIGS. 2A and 2B, the through holes of the vias 103 are also filled with the sealing resin 46 and the resist layer 99 is not provided on the through holes of the vias 103 according to the wiring board 91 of the semiconductor device 90.

Accordingly, the inside of the through holes of the vias 103 has a monolithic structure with the sealing resin 46 provided on the resist layer 99 on the upper surface of the wiring board 91, so that there is no difference in the coefficient of thermal expansion between the resin provided inside the through holes of the vias 103 and the sealing resin 46 provided on the resist layer 99 on the upper surface of the wiring board 91.

Therefore, it is possible to avoid the concentration of stress on the periphery of the vias 13 of the wiring board 1 due to the difference between the coefficient of thermal expansion of the via filling resin 12 with which the vias 13 are filled and the coefficient of thermal expansion of the sealing resin 6 in the structure shown in FIGS. 1A and 1B and FIGS. 2A and 2B. Accordingly, the reliability of the vias 103 of the wiring board 91 is not impaired in the heat treatment applied at the time of mounting the semiconductor device 90 on a motherboard.

Further, since the sealing resin 46 is also provided inside the through holes of the vias 103, the area of adhesion by the sealing resin 46 is larger than in the structure shown in FIGS. 1A and 1B and FIGS. 2A and 2B. Accordingly, stress hardly concentrates on the vias 103, so that it is possible to prevent separation of the sealing resin 46 on the vias 103.

In the semiconductor device 10 shown in FIGS. 1A and 1B, the same resin as the sealing resin 6 may be used as the via filling resin 12. In this case as well, however, it is not possible to avoid a problem in that stress concentrates on the periphery of the vias 13 of the wiring board 1 so as to cause separation of the sealing resin 6 at the interface between the resist layer 9A and the sealing resin 6 positioned above the vias 13.

That is, in this case, the same resin in gel form as the sealing resin 6 is provided, heated, and solidified in the vias 13 under a high-temperature, high-pressure condition, and the sealing resin 6 is thereafter provided on the wiring board 1 in the manufacturing process of the semiconductor device 10. Accordingly, at the time of providing the sealing resin 6 on the wiring board 11, a resin different from the sealing resin 6 is already provided in the through holes of the vias 13, so that a two-layer structure of different types of resin, that is, the via filling resin 12 and the sealing resin 6, is formed. Therefore, it is not possible to avoid the problem of separation of the sealing resin 6 at the interface between the resist layer 9A and the sealing resin 6 positioned above the vias 13.

On the other hand, according to this example, at the time of sealing the part on the upper side of the wiring board 91 with the sealing resin 46, the through holes of the vias 103, on which the resist layer 99 is not provided, are filled with the sealing resin 46, so that the inside of the through holes of the vias 103 and the sealing resin 46 provided on the resist layer 99 on the upper surface of the wiring board 91 have a unitary structure. Accordingly, there is no difference in the coefficient of thermal expansion between the resin provided inside the through holes of the vias 103 and the sealing resin 46 provided on the resist layer 99 on the upper surface of the wiring board 91, so that there is no separation of the sealing resin 46.

According to this example, one or more grooves may be formed in part of the resist layer 99 other than where the solder balls 44 are provided on the lower surface of the wiring board 91, that is, a principal surface of the wiring board 91 on which the solder balls 44 are provided. A description is given of this with reference to FIG. 11 through FIG. 14.

Figure 11:
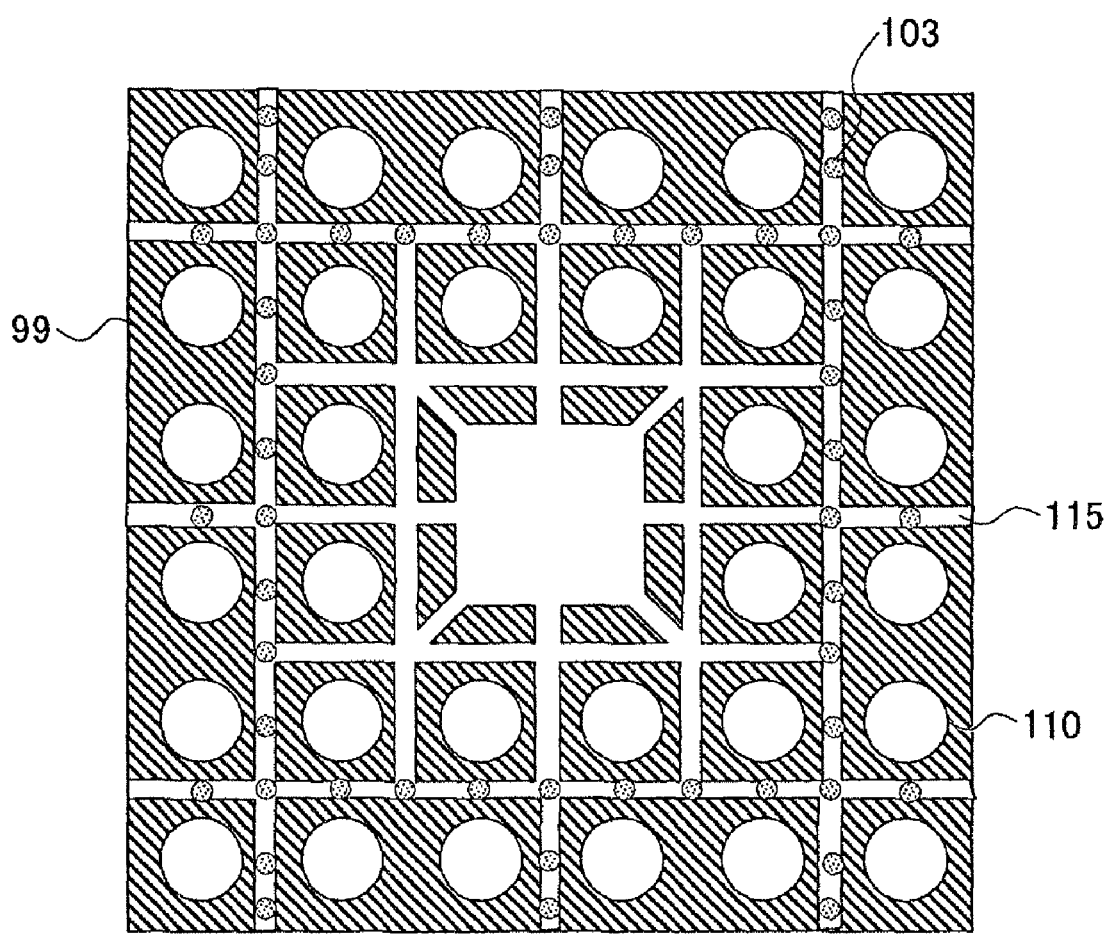
FIG. 11 is a bottom view of the wiring board shown in FIGS. 10A and 10B, where grooves are formed in a resist layer on the lower surface of the wiring board according to the embodiment of the present invention.

FIG. 11 is a bottom view of the wiring board 91 shown in FIGS. 10A and 10B, where grooves are formed in the resist layer 99 on the lower surface of the wiring board 91.

Referring to FIG. 11, multiple grooves 115 are formed in a substantially grid-like manner in part of the resist layer 99 other than where the solder balls 44 are provided (a solder ball provision part 110) on the lower surface of the wiring board 91, that is, a principal surface of the wiring board 91 on which the solder balls 44 are provided. Further, the grooves 115 are connected to the lower ends of the vias 103 formed through the wiring board 91.

The grooves 115 function as a channel through which the air inside the through holes of the vias 103 escapes when the sealing resin 46 is injected into the vias 103 using a mold. Accordingly, at the time of providing the sealing resin 46 on the wiring board 91 for resin sealing and filling the through holes of the vias 103 with the sealing resin 46, the air inside the through holes of the vias 103 escapes to the grooves 115 so as to facilitate a flow of the sealing resin 46 into the through holes of the vias 103. That is, the grooves 115 serve as a vent in a so-called mold, and the formation of the grooves 115 ensures that the vias 103 are filled with the sealing resin 46.

Figure 12:
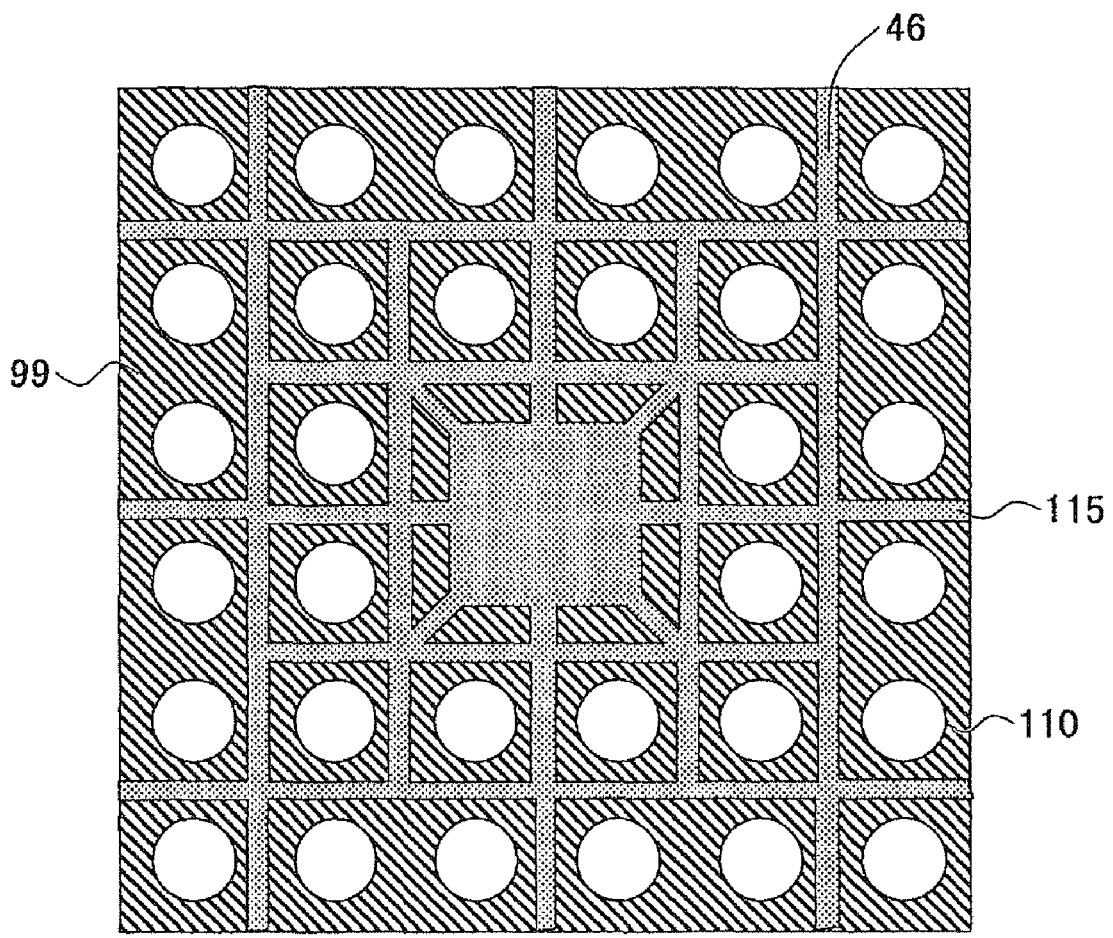
FIG. 12 is a bottom view of the wiring board of the structure shown in FIG. 11, where vias are filled with sealing resin according to the embodiment of the present invention.

FIG. 12 is a bottom view of the wiring board 91 of the structure shown in FIG. 11, where the vias 103 are filled with the sealing resin 46.

When the vias 103 of the wiring board 91 of the structure shown in FIG. 11 are filled with the sealing resin 46, the sealing resin 46 also flows into the grooves 115 connected to the lower sides of the vias 103 so as to hide the vias 103 as shown in FIG. 12.

Further, since the grooves 115 are formed in part of the resist layer 99 other than where the solder balls 44 are provided (the solder ball provision part 110), the sealing resin 46 is prevented from being provided in where the solder balls 44 are provided (the solder ball provision part 110).

Figure 13:
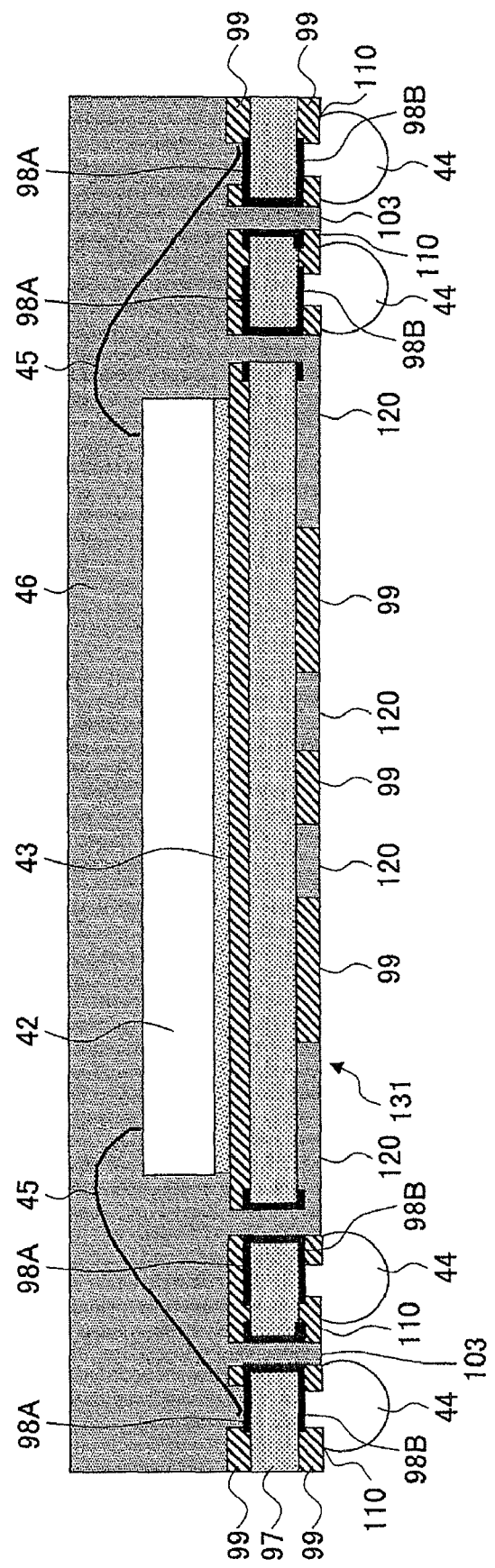
FIG. 13 is a cross-sectional view of a semiconductor device for illustrating the effect of grooves formed to connect to the lower ends of the vias in part of the resist layer other than a solder ball provision part 110 on the lower surface of a wiring board according to the embodiment of the present invention.

A further description is given, with reference to FIG. 13, of the effect of grooves formed to connect to the lower ends of the vias 103 in part of the resist layer 99 other than the solder ball provision part 110 on the lower surface of a wiring board.

FIG. 13 is a cross-sectional view of a semiconductor device 130 for illustrating the effect of grooves formed to connect to the lower ends of the vias 103 in part of the resist layer 99 other than the solder ball provision part 110 on the lower surface of a wiring board. In FIG. 13, the same elements as those of the semiconductor device 90 described with reference to FIGS. 9A and 9B are referred to by the same numerals, and a description thereof is omitted.

Referring to FIG. 13, multiple grooves 120 are formed to connect to the lower ends of the vias 103 in parts of the resist layer 99 other than the solder ball provision part 110 on the lower surface of a wiring board 131.

The sealing resin 46 with which the through holes of the vias 103 are filled flows to be provided in the grooves 120 at the time of performing resin sealing. The upper surface of the sealing resin 46 in the grooves 120 forms a single plane with the upper surface of the resist layer 99 on the lower surface of the wiring board 131, and does not pass (flow over) the top of the solder balls 44 provided in the solder ball provision part 110. Accordingly, the sealing resin 46 is prevented from impairing the connection through the solder balls 44 provided on the wiring board 131 when the semiconductor device 130 is mounted on a motherboard (whose graphical representation is omitted). As a result, it is possible to increase the reliability of the connection between the wiring board 131 and the motherboard through the solder balls 44.

Further, according to this example, the sealing resin 46 is provided on the wiring board 131, in the vias 103 provided inside the wiring board 131, and in the grooves 120 formed in part of the resist layer 99 other than the solder ball provision part 110 on the lower surface of the wiring board 131 so as to connect to the lower ends of the vias 103. That is, the single sealing resin 46 is provided on the upper and lower sides of the wiring board 131 so as to hold the wiring board 131 and is further provided inside the wiring board 131 as well.

As described above, in the case of a two-layer structure formed of the via filling resin 12 provided inside the wiring board 1 and the sealing resin 6 provided on the wiring board 1 and containing the semiconductor element 2, etc., as shown in FIGS. 1A and 1B and FIGS. 2A and 2B, there may be a large warp caused in the semiconductor device 10 because of the difference between the physical property values of the wiring board 1 and the sealing resin 6. The warp of the semiconductor device 10 may cause a difference in height (vertical position) between the solder balls 4 at the time of mounting the semiconductor device 10 on a motherboard. As a result, no connection can be established to the motherboard with the solder balls 4 that are positioned vertically high, and a short circuit may be caused between terminals with the solder balls 4 that are positioned vertically low.

On the other hand, according to this example, unlike the two-layer structure shown in FIGS. 1A and 1B and FIGS. 2A and 2B, the single sealing resin 46 is provided on the upper and lower sides of the wiring board 131 so as to hold the wiring board 131 and is further provided inside the wiring board 131 as well. As a result, it is possible to prevent a warp due to the difference between the physical property values of materials in the semiconductor device 130, so that the semiconductor device 130 can have more structural strength as a semiconductor device.

Referring back to FIG. 11, the multiple grooves 115 are formed in a substantially grid-like manner in part of the resist layer 99 other than the solder ball provision part 110 on the lower surface of the wiring board 91, and the grooves 115 are formed with a substantially uniform width in the case of FIG. 11. However, the grooves 115 are not limited to a particular shape.

The volume of the provided sealing resin 46 may be caused to differ between the center and the peripheral part of the semiconductor device 90 (the wiring board 91) by adding a predetermined change to the width of the grooves 115 instead of keeping the width of the grooves 115 uniform, that is, depending on the warp condition of the semiconductor device 90. Thereby, it is possible to control the effect of the sealing resin 46 on the lower side of the wiring board 91, so that it is possible to reduce the amount of warping of the semiconductor device 90.

Figure 14:
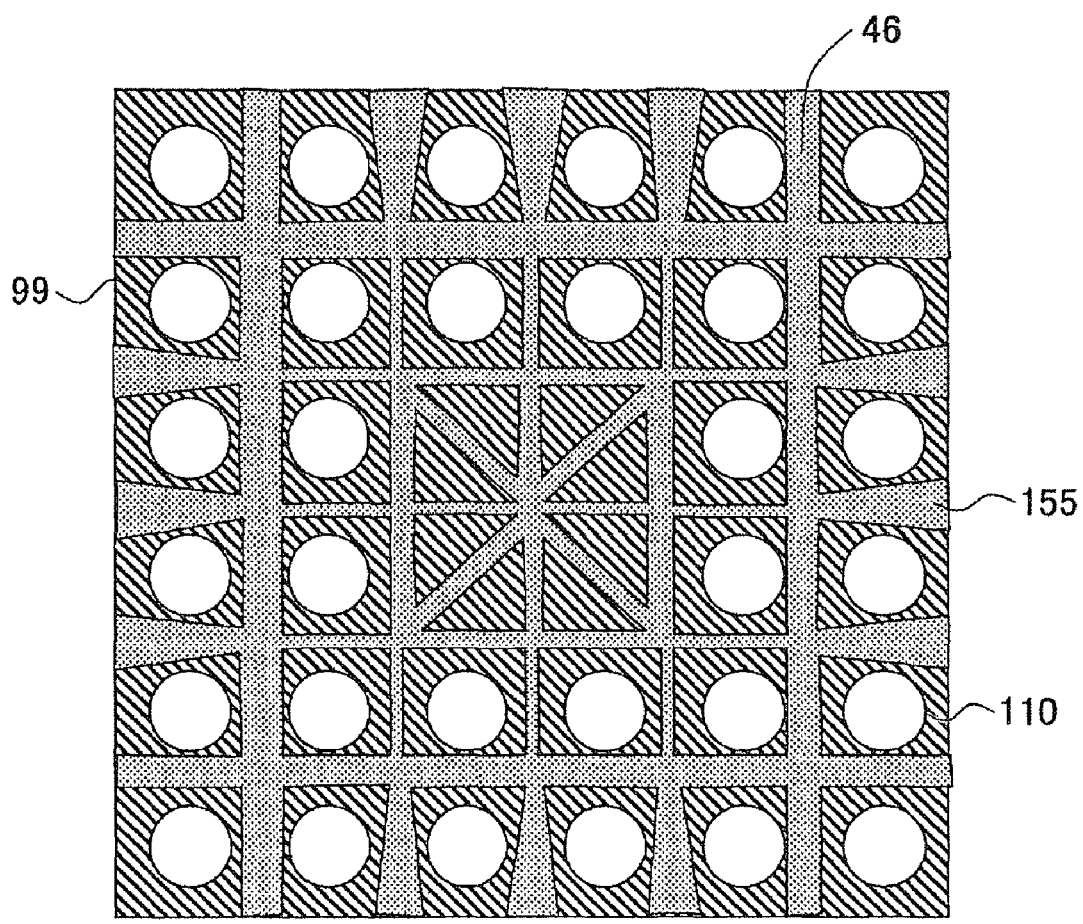
FIG. 14 is a bottom view of a wiring board, showing a variation of grooves shown in FIG. 11, in which vias (not graphically illustrated) and grooves connected to the vias are filled with the sealing resin according to the embodiment of the present invention.

For example, the groove shape may be as shown in FIG. 14. FIG. 14 is a bottom view of a wiring board 151, showing a variation of the grooves 115 shown in FIG. 11, in which vias (not graphically illustrated) and grooves 155 connected to the vias are filled with the sealing resin 46. In FIG. 14, the same elements as those of the wiring board 91 described with reference to FIG. 11 are referred to by the same numerals, and a description thereof is omitted.

In the case shown in FIG. 14, the width of the grooves 155 increases from the center side to the peripheral part of the wiring board 151 so that the volume of the sealing resin 46 provided on the lower surface of the wiring board 151 increases in the same direction.

According to the grooves 155 thus shaped, for example, if a semiconductor device having a semiconductor element mounted on the upper surface of the wiring board 151 warps so as to be higher in the periphery than in the center, the warp is suitably reversed by the sealing resin 46 provided on the upper surface of the wiring board 151 and the sealing resin 46 of a larger volume provided on the peripheral part of the lower surface of the wiring board 151.

Further, for example, if a semiconductor device having a semiconductor element mounted on the upper surface of the wiring board 151 warps so as to be lower in the periphery than in the center, the warp is suitably reversed by causing the width of the grooves 155 to be reduced from the center side to the peripheral part of the wiring board 151 so that the sealing resin 46 provided on the lower surface of the wiring board 151 is reduced in volume in the same direction.

[Method of Manufacturing Semiconductor Device]

Next, a description is given of a method of manufacturing the semiconductor device of each of the above-described examples.

(a) Method of Manufacturing First Example of Semiconductor Device

Figure 15A:
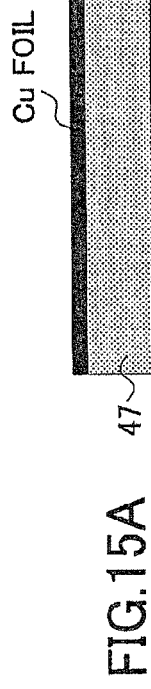
FIGS. 15A through 15N are diagrams showing a process of manufacturing the wiring board shown in FIGS. 4A and 4B according to the embodiment of the present invention.
Figure 15B:
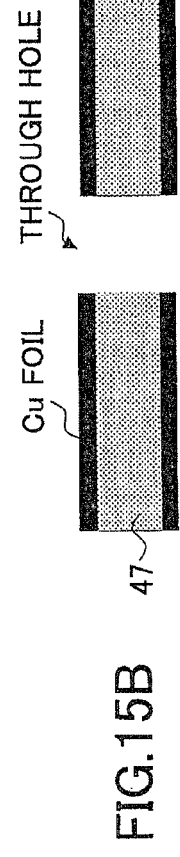
Figure 15C:
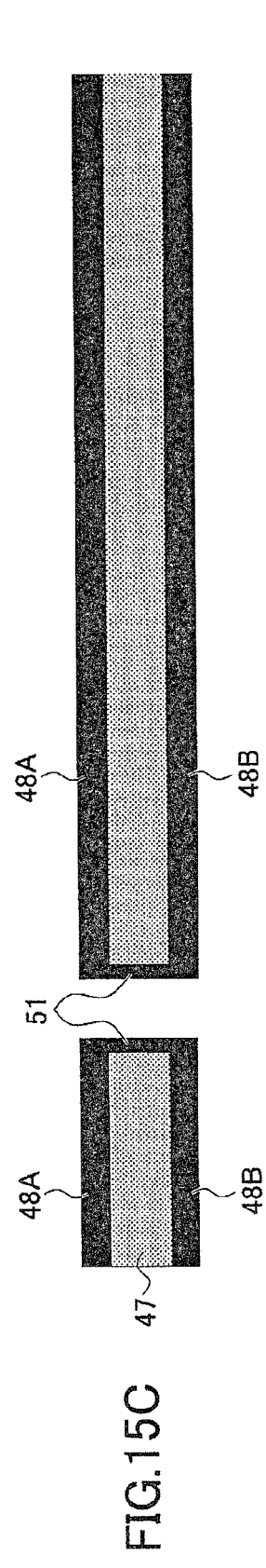
Figure 15G:
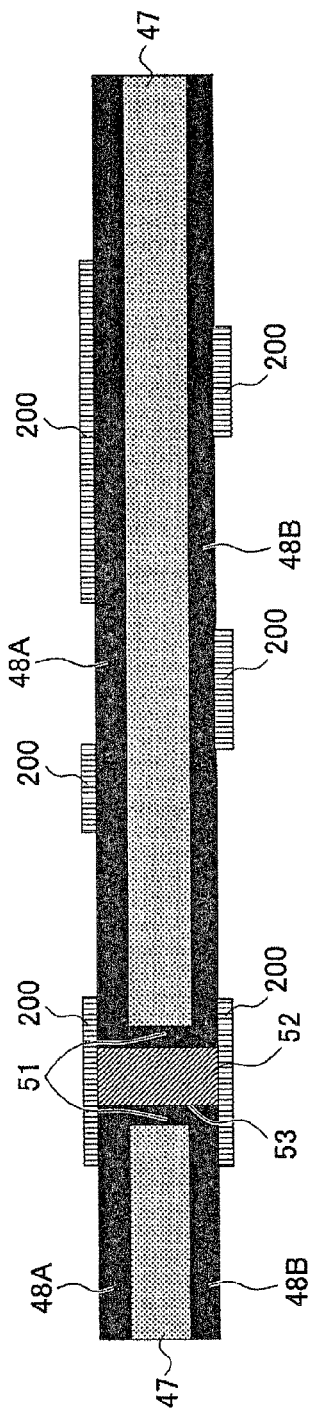
Figure 15H:
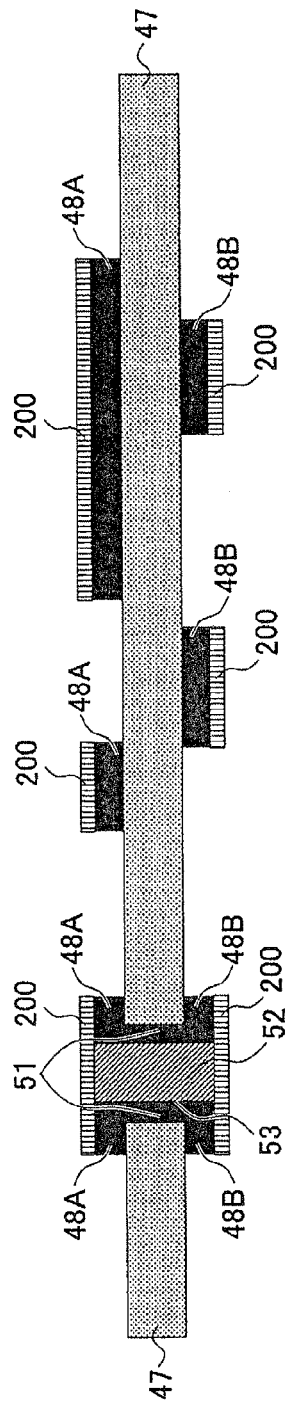
Figure 15I:
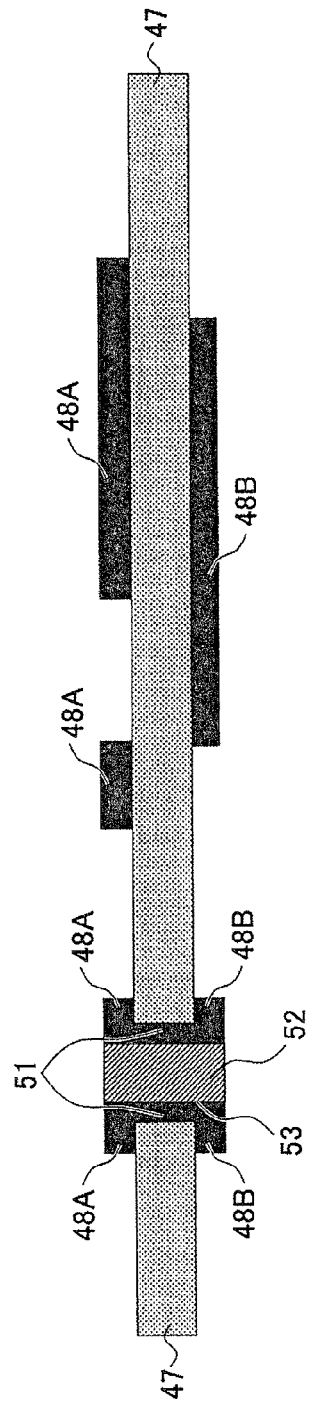
Figure 15M:
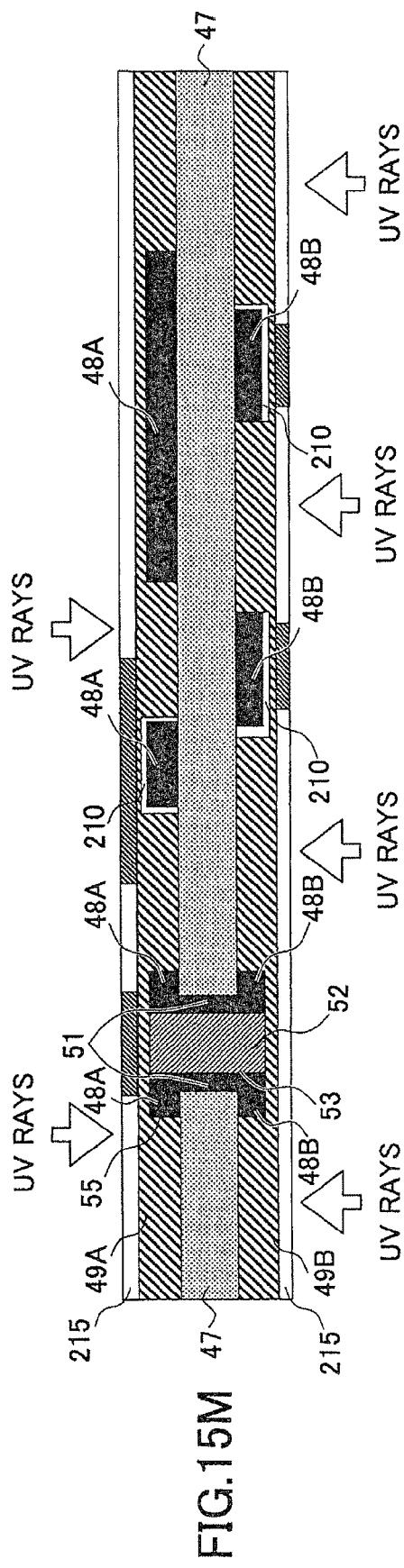
Figure 15N:
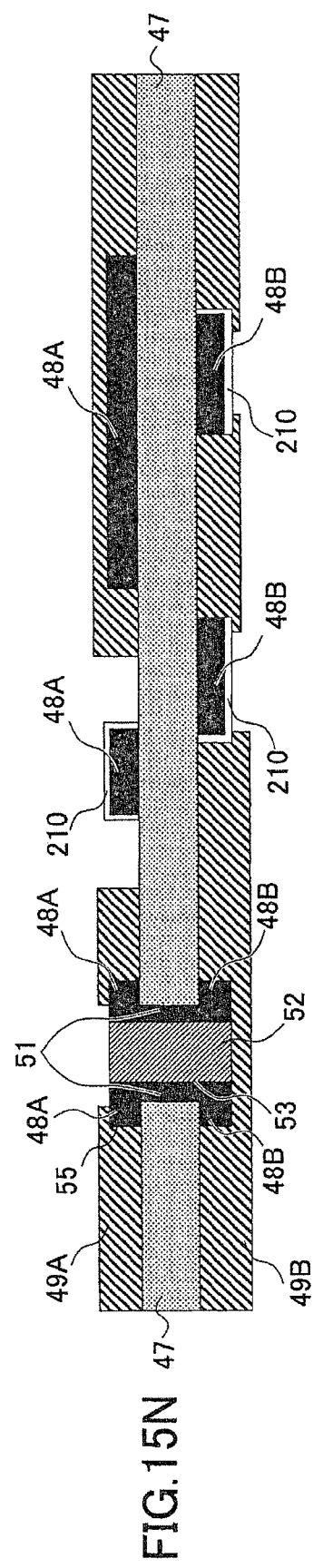

With respect to the semiconductor device 40 according to the first example of the semiconductor device of the present invention shown in FIGS. 4A and 4B, first, the wiring board 41 of the semiconductor device 40 is manufactured in accordance with the process shown in FIGS. 15A through 15N. FIGS. 15A through 15N are diagrams showing a process of manufacturing the wiring board 41 shown in FIGS. 4A and 4B.

In manufacturing the wiring board 41 of the semiconductor device 40, the board base 47, having copper (Cu) foil applied on its surfaces, formed of insulating resin such as glass epoxy resin, and cut into a predetermined size, is prepared (FIG. 15A), and a through hole is formed in the board base 47 by a known mechanical method or the like (FIG. 15B). This through hole is to serve as the via 53.

Next, layers of copper (Cu) are formed on the top surface (upper surface) and the bottom surface (lower surface) of the board base 47 to which copper (Cu) foil is applied and on the inner wall of the through hole by electroless plating (FIG. 15C). As a result of this process, the layers of copper (Cu) formed on the top surface (upper surface) and the bottom surface (lower surface) of the board base 47 to which copper (Cu) foil is applied form the wiring layers 48A and 48B, and the part of copper (Cu) formed on the inner wall of the through hole forms the wiring part 51.

Thereafter, the plugging ink of the via filling resin 52, formed of, for example, silicon resin, acrylic resin, or epoxy resin, is formed in the through hole by a known printing process. Further, a projection formed to project from the through hole is polished (plug polishing), so that the through hole is filled with the via filling resin 52 (FIG. 15D).

Next, photosensitive films (dry films) 200 are applied on the wiring layers 48A and 48B and the outside exposed surfaces of the via filling resin 52 (FIG. 15E). Further, each photosensitive film 200 is exposed to ultraviolet rays with a photomask 205 provided thereon, so that the photosensitive layer of the exposed part of the photosensitive film 200 is photocured (FIG. 15F).

Next, the photomasks 205 are removed and parts of the photosensitive films 200 are removed. The photosensitive layer of each photosensitive film 200 subjected to the exposure is developed, so that the photosensitive layer of the unexposed part of each photosensitive film 200 is removed (FIG. 15G). The remaining cured photosensitive layers serve as a protection material (resist) for the wiring layers 48A and 48B.

Next, the parts of the wiring layers 48A and 48B not covered with the protection material (resist) are removed by etching (FIG. 15H). Then, the protection material (resist) is removed. As a result, the parts of the wiring layers 48A and 48B positioned below the protection material (resist) remain, so that the pattern of the wiring layer 48A and the pattern of the wiring layer 48B are formed (FIG. 15I).

Thereafter, nickel (Ni)/gold (Au) plating 210 is provided on predetermined parts of the wiring layers 48A and 48B through resist formation using a mask of gold (Au) or the like and subsequent exposure and development on the upper and lower surfaces of the board base 47 and the surfaces of the wiring layers 48A and 48B, and the mask is removed. FIG. 15J shows this state.

Next, photosensitive films (dry films) are applied on the upper and lower surfaces of the board base 47 and the surfaces of the wiring layers 48A and 48B in order to form extra wiring etching masks for removing extra parts of the wiring board. Each photosensitive film is exposed to ultraviolet rays with a photomask provided thereon, so that the photosensitive layer of the exposed part of the photosensitive film is photocured.

Next, the photomasks are removed and parts of the photosensitive films are removed. The photosensitive layer of each photosensitive film subjected to the exposure is developed, so that the photosensitive layer of the unexposed part of each photosensitive film is removed. The remaining cured photosensitive layers serve as a protection material (resist) for the wiring layers 48A and 48B.

Next, the parts of the wiring layers 48A and 48B not covered with the protection material (resist) are removed by etching. Then, the protection material (resist) is removed. As a result, the parts of the wiring layers 48A and 48B positioned below the protection material remain, so that the pattern of the wiring layer 48A and the pattern of the wiring layer 48B are formed. FIG. 15K shows this state.

Thereafter, the resist layers 49A and 49B of solder resist or the like, formed of a photosensitive material, are formed on the upper and lower surfaces of the board base 47 and the wiring layers 48A and 48B (FIG. 15L).

Next, the resist layers 49A and 49B are exposed to ultraviolet rays with parts thereof that require openings, that is, the upper surface of the via filling resin 52 with which the via 53 is filled and parts where the solder balls 44 are to be provided in a subsequent process, being masked with solder resist films 215, so that the exposed parts of the solder resist layers 49A and 49B (FIG. 15M) are photocured. At this point, with respect to the upper surface of the via filling resin 52 with which the via 53 is filled, the mask diameter is determined so as to be greater than the diameter of the through hole of the via 53 and smaller than the diameter of the via land 55 surrounding the through hole of the via 53 and connected to the wiring layer 48A.

Next, the solder resist masks (films) 215 are removed and development is performed, so that the unexposed parts of the solder resist layers 49A and 49B, that is, the solder resist layers 49A and 49B on the upper surface of the via filling resin 52 with which the via 53 is filled and in parts where the solder balls 44 are to be provided in a subsequent process, are removed (FIG. 15N). As a result, an opening having a diameter greater than the diameter of the through hole of the via 53 and smaller than the diameter of the via land 55 surrounding the through hole of the via 53 and connected to the wiring layer 48A is formed on the via filling resin 52 with which the via 53 is filled in the resist layer 48A.

Thus, the wiring board 41 having the structure shown in FIGS. 4A and 4B and FIGS. 5A and 5B is completed.

Thereafter, as known, the semiconductor element 42 is provided on the upper surface of the wiring board 41 with the die bonding material 43 such as a die bonding film interposed therebetween, the semiconductor element 42 and the wiring board 41 are connected with the bonding wires 45, and the sealing resin 46 such as silicon resin, acrylic resin, or epoxy resin is provided on the wiring board 41 for sealing. Thereafter, the multiple solder balls 44 formed mainly of solder and serving as external connection terminals such as spherical electrode terminals are provided in a grid-like manner on the other principal surface (lower surface) of the wiring board 41. Separation into individual pieces is performed by, for example, dicing with a dicing saw on the basis of the resin-sealed semiconductor element 42 and the bonding wires 45 lead out from the semiconductor element 42 as a unit, so that the individual semiconductor devices 40 shown in FIGS. 4A and 4B are completed.

Thus, according to the method of this example, the wiring board 41 having the structure shown in FIGS. 4A and 4B and FIGS. 5A and 5B can be easily manufactured by preparing a board having through holes forming the vias 53 formed therein and filled with the via filling resin 52 and performing known processing on this board. Further, the semiconductor device 40 having the structure shown in FIGS. 4A and 4B can be easily manufactured by performing known processing on the wiring board 41. Therefore, according to the method of this example, it is possible to easily manufacture a semiconductor device having the structure shown in FIGS. 4A and 4B in a simple manner and at low cost.

(b) Method of Manufacturing Second Example of Semiconductor Device

Figure 16A:
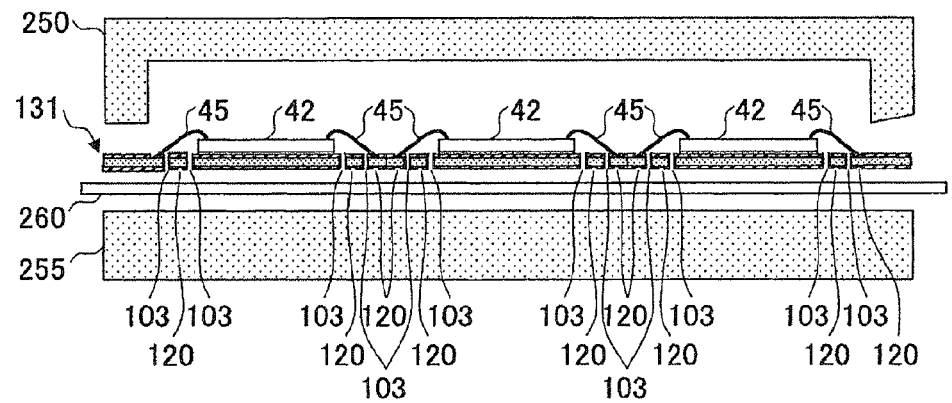
FIGS. 16A through 16C are diagrams showing a manufacturing process of the second example of the semiconductor device shown in FIG. 13 according to the embodiment of the present invention.
Figure 16B:
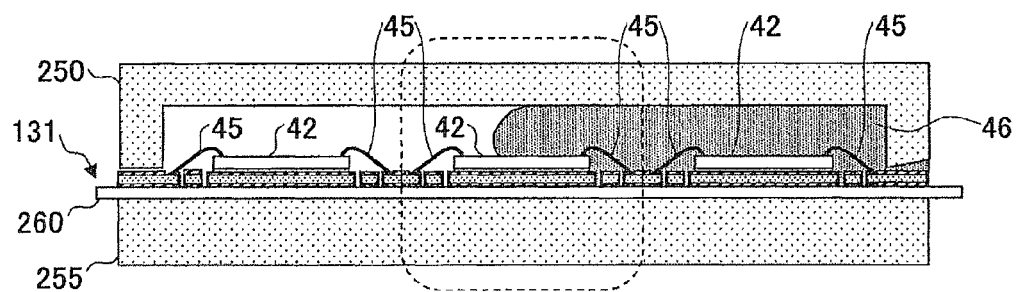
Figure 16C:
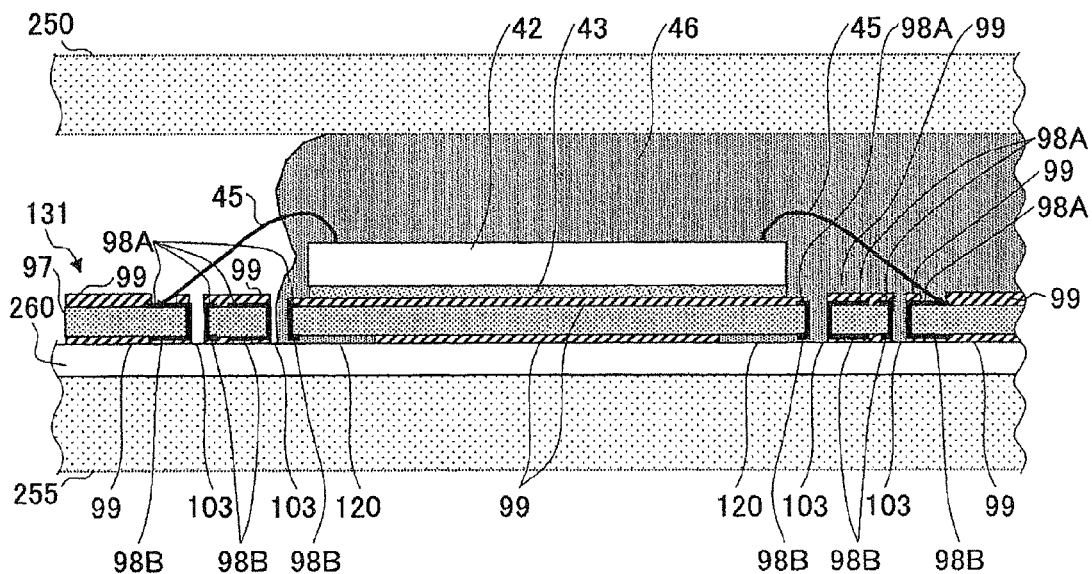

Next, a description is given, with reference to FIGS. 16A through 16C, of a method of manufacturing the semiconductor device 130 according to the second example of the semiconductor device of the present invention. FIGS. 16A through 16C are diagrams showing a manufacturing process of the semiconductor device 130 according to the second example of the semiconductor device of the present invention.

Referring to FIGS. 16A through 16C, in this example, first, the wiring board 131, which has the semiconductor elements 42 mounted on its upper surface with the die bonding material 43 such as a die bonding film interposed therebetween and is connected to the semiconductor elements 42 through the bonding wires 45, is placed between an upper mold 250 and a lower mold 255 of a molding apparatus (FIG. 16A).

At this point, by a known board manufacturing method, the wiring board 131 has the vias 103, which are through holes, formed therein and the multiple grooves 120 formed in part of the resist layer 99 other than the solder ball provision part 110 on the lower surface of the wiring board 131 so as to connect to the lower ends of the vias 103. The grooves 120 may be formed so as to have the shape of the grooves 115 shown in FIG. 11 or the shape of the grooves 155 shown in FIG. 14 by a known board manufacturing method.

A sheet 260 formed of, for example, a fluorinated material such as polytetrafluoroethylene (PTFE) is interposed between the lower surface of the wiring board 131 and the lower mold 255.

Further, the sheet 260 has a predetermined elastic force so that the elasticity effect of the sheet 260 increases the adhesion between the lower surface of the wiring board 131 and the lower mold 255 so as to make it possible to prevent a gap from being formed therebetween. Accordingly, it is possible to prevent the sealing resin 46 from overflowing the grooves 120 formed in the resist layer 99 on the lower surface of the wiring board 131 and adhering to the lower mold 255 at the time of filling the space between the upper mold 250 and the lower mold 255 with the sealing resin 46 in the next process.

Next, the upper mold 250 and the lower mold 255 are closed and transfer molding is performed, that is, the space between the upper mold 250 and the lower mold 255 is filled with the sealing resin 46 (FIG. 16B). The part circled with a dotted line in FIG. 16B is shown enlarged in FIG. 16C.

Referring to FIG. 16C, the sealing resin 46 injected into the space between the upper mold 250 and the lower mold 255, that is, a cavity, flows over the wiring board 131 so as to further fill in the through holes of the vias 103 and further flow into the grooves 120.

That is, the through holes of the vias 103 are filled with the sealing resin 46 when the part on the upper side of the wiring board 131 is sealed with the sealing resin 46, so that the inside of the through holes of the vias 103 and the part on the upper side of the wiring board 131 have a monolithic structure through the sealing resin 46.

The grooves 120 serve as a channel through which the air inside the through holes of the vias 103 escapes when the sealing resin 46 enters the vias 103. Accordingly, when the sealing resin 46 is provided on the wiring board 131 for resin sealing and the through holes of the vias 103 are filled with the sealing resin 46, the air inside the through holes of the vias 103 escapes to the grooves 120 so as to facilitate a flow of the sealing resin 46 into the through holes of the vias 103. That is, the grooves 120 serve as a vent in a so-called mold, and the formation of the grooves 120 ensures that the vias 103 are filled with the sealing resin 46.

Resin sealing is completed when the part on the upper side of the wiring board 131, the through holes of the vias 103, and the grooves 120 are all filled with the sealing resin 46.

Thereafter, the multiple solder balls 44 formed mainly of solder and serving as external connection terminals such as spherical electrode terminals are provided in a grid-like manner on the other principal surface (lower surface) of the wiring board 131. Separation into individual pieces is performed by, for example, dicing with a dicing saw on the basis of the resin-sealed semiconductor element 42 and the bonding wires 45 led out from the semiconductor element 42 as a unit, so that the individual semiconductor devices 130 shown in FIG. 13 are completed.

Thus, according to the method of this example, it is possible to obtain a structure where the vias 103 are filled with the same sealing resin 46 as provided on the wiring board 91, 131, or 151 by preparing the wiring board 91, 131, or 151 in which the vias 103 and the grooves 115, 120, or 155 are preformed and filling the vias 103 and the grooves 115, 120, or 155 with the sealing resin 46 at the time of sealing the part on the upper side of the wiring board 91, 131, or 151 with resin by resin sealing in the manufacturing process of the semiconductor device 90 or 130, so that it is possible to manufacture a more reliable semiconductor device in a simple manner.

Additionally, according to one embodiment of the present invention, there is provided a wiring board having a semiconductor element mounted and sealed with a sealing resin on a surface thereof, the wiring board including: a via formed through the wiring board; and a resist layer covering the surface of the wiring board, wherein the resist layer has an opening in a part thereof positioned on the via, and the sealing resin is provided in the opening.

Further, in the wiring board, the sealing resin may be provided in the via.

Further, in the wiring board, a groove part connecting to the via may be formed in an additional resist layer covering another surface of the wiring board, and the sealing resin may be provided in the groove part.

The present invention is not limited to the specifically disclosed embodiment, and variations and modifications may be made without departing from the scope of the present invention.

What is claimed is:

1. A semiconductor device, comprising:
   a wiring board having a via formed therein;
   a semiconductor element provided on the wiring board;
   a resist layer covering a surface of the wiring board, the resist layer having an opening in a part thereof positioned on the via;
   a sealing resin covering a surface of the via in the opening and the resist layer, and sealing the semiconductor element; and
   a resin having a physical property different from a physical property of the sealing resin, the resin being provided inside the via.

2. The semiconductor device as claimed in claim 1, wherein the opening of the resist layer has a diameter greater than a diameter of a through hole of the via and smaller than a diameter of a via land.

3. The semiconductor device as claimed in claim 2, wherein the diameter of the via land is 1.2 to 1.5 times the diameter of the opening of the resist layer.

4. A semiconductor device comprising:
   a wiring board having a plurality of vias formed therein;

a semiconductor element provided on the wiring board;

a resist layer covering a surface of the wiring board, the resist layer having a plurality of openings in a part thereof positioned on the vias;

a sealing resin covering a surface of the vias in the openings and the resist layer, and sealing the semiconductor element, the sealing resin filling in the vias; and a groove part connecting to the vias is formed in an additional resist layer covering another surface of the wiring board, and the sealing resin is provided in the groove part.

5. The semiconductor device as claimed in claim 4, wherein the groove part is formed in a part of the additional resist layer other than a part thereof where an external connection terminal is provided.

6. The semiconductor device as claimed in claim 4, wherein a width of the groove part is non-uniform.

7. The semiconductor device as claimed in claim 6, wherein the width of the groove part increases in a direction from a center to a periphery of the wiring board so that a volume of the sealing resin provided in the groove part increases in the direction.

8. The semiconductor device as claimed in claim 6, wherein the width of the groove part decreases in a direction from a center to a periphery of the wiring board so that a volume of the sealing resin provided in the groove part decreases in the direction.

9. The semiconductor device as claimed in claim 4, wherein a surface of the sealing resin provided in the groove part which surface faces toward the wiring board forms a substantially single plane with a surface of the additional resist layer which surface faces toward the wiring board.

* * * * *